United States Patent
Peng et al.

(10) Patent No.: US 12,183,788 B2
(45) Date of Patent: *Dec. 31, 2024

(54) SEMICONDUCTOR ARRANGEMENT COMPRISING A SOURCE PAD, GATE PAD, DRAIN PAD, BACKSIDE INTERCONNECT LINE, AND BACKSIDE CONTACT, AND BACKSIDE CONDUCTIVE LINE AND METHOD OF MAKING

(71) Applicant: TAIWAN SEMICONDUCTOR MANUFACTURING COMPANY LIMITED, Hsin-Chu (TW)

(72) Inventors: Shih-Wei Peng, Hsinchu (TW); Jiann-Tyng Tzeng, Hsin Chu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/231,847

(22) Filed: Aug. 9, 2023

(65) Prior Publication Data
US 2023/0387201 A1 Nov. 30, 2023

Related U.S. Application Data

(63) Continuation of application No. 17/336,469, filed on Jun. 2, 2021, now Pat. No. 11,810,949.
(60) Provisional application No. 63/163,494, filed on Mar. 19, 2021.

(51) Int. Cl.
H01L 29/06 (2006.01)
H01L 29/78 (2006.01)

(52) U.S. Cl.
CPC ...... *H01L 29/0673* (2013.01); *H01L 29/7827* (2013.01)

(58) Field of Classification Search
CPC ............ H01L 29/0673; H01L 29/7827; H01L 21/823871; H01L 21/823885; H01L 27/092; H01L 29/41741; H01L 29/42376
See application file for complete search history.

(56) References Cited

U.S. PATENT DOCUMENTS 11,810,949 B2 * 11/2023 Peng .................... H01L 27/092

* cited by examiner

*Primary Examiner* — Changhyun Yi
(74) *Attorney, Agent, or Firm* — Cooper Legal Group, LLC

(57) ABSTRACT

A method of forming a semiconductor arrangement includes forming a first source pad over a semiconductor layer. A first nanosheet is formed contacting the first source pad. A gate pad is formed adjacent the first nanosheet. A first drain pad is formed over the gate pad and contacting the first nanosheet. A backside interconnect line is formed under the gate pad and the first source pad. A first backside contact is formed contacting at least one of the backside interconnect line, the first source pad, or the gate pad.

20 Claims, 18 Drawing Sheets

SEMICONDUCTOR ARRANGEMENT COMPRISING A SOURCE PAD, GATE PAD, DRAIN PAD, BACKSIDE INTERCONNECT LINE, AND BACKSIDE CONTACT, AND BACKSIDE CONDUCTIVE LINE AND METHOD OF MAKING

RELATED APPLICATIONS

This application is a continuation of U.S. Non-Provisional application Ser. No. 17/336,469, titled "Semiconductor Arrangement and Method of Making" and filed on Jun. 2, 2021, which claims priority to U.S. Provisional Application 63/163,494, titled "Semiconductor Arrangement and Method of Manufacture" and filed on Mar. 19, 2021. U.S. Non-Provisional application Ser. No. 17/336,469 and U.S. Provisional Application 63/163,494 are incorporated herein by reference.

BACKGROUND

As the semiconductor industry has progressed into nanometer technology process nodes in pursuit of higher device density, higher performance, and lower costs, challenges from both fabrication and design issues have resulted in the development of three dimensional designs, such as vertical transistors.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
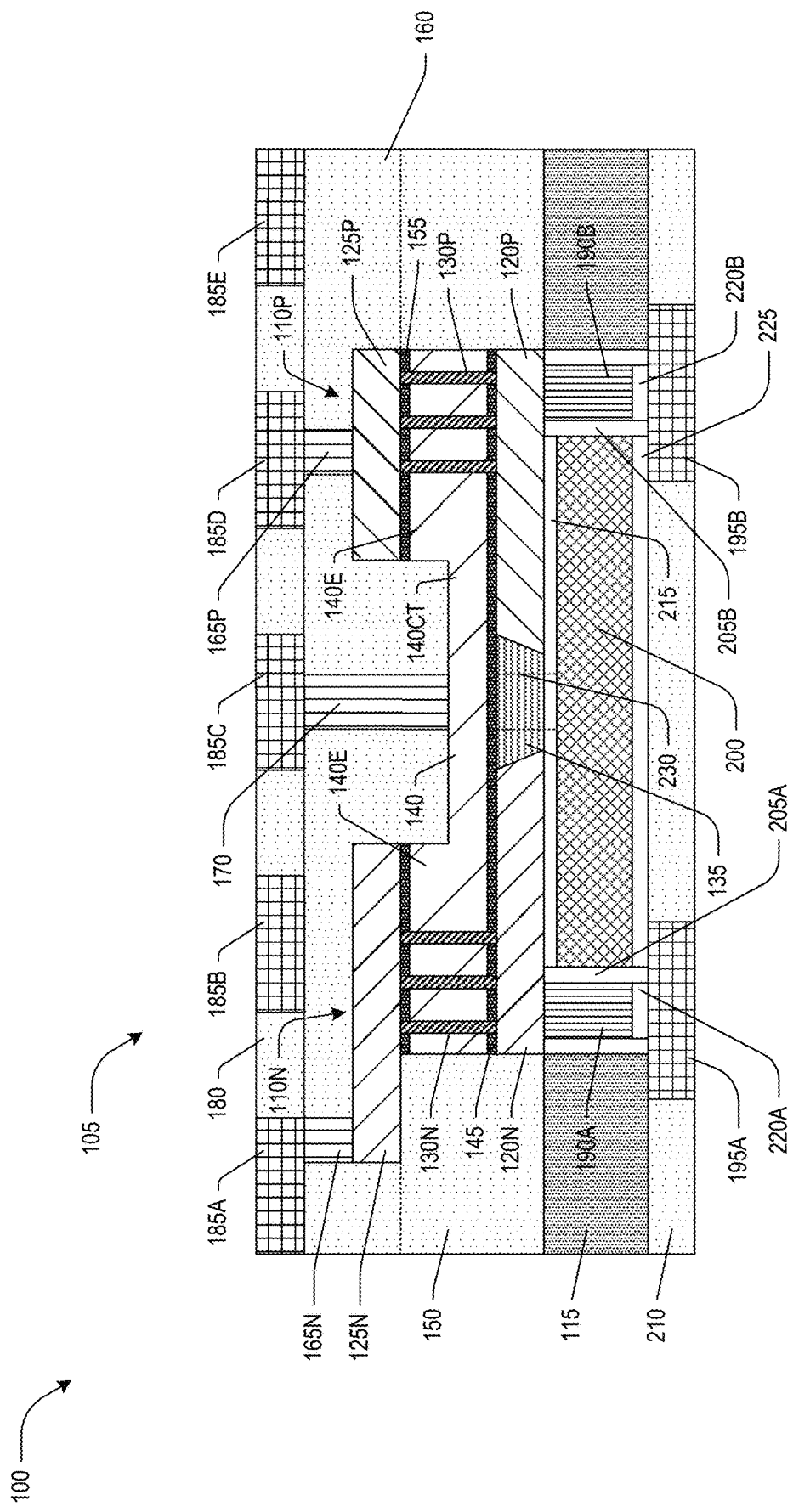
FIG. 1 is a cross-section view of a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for fabricating a semiconductor arrangement are provided herein. In some embodiments, unit cells within a chip are configured to perform logic functions. A unit cell comprises a complimentary pair of transistors, such an n-type transistor and a p-type transistor. Each unit cell or group of unit cells may be interconnected to function as an inverter, a not-and gate (NAND), an and-or inverter, a not-or (NOR) gate, an AND gate, or some other logic gate configuration. A vertical unit cell architecture employing nanosheets and backside interconnections allows top side or backside contacts to be provided to apply power supply voltages or gate voltages to the unit cell. A backside interconnect line under the unit cell allows flexibility in interconnecting the unit cells. The backside interconnect line may be connected to source pads or gate pads of transistors in the unit cell. Vertical nanowire devices in unit cells provide decreased capacitance compared to a fin field-effect transistor (finFET) device. Although reference is made to vertical nanowire devices, such as vertical nanowire transistors or vertical nanosheet transistors, the transistors in the unit cell may include transistors selected from three-dimensional transistors, such as three-dimensional finFETs, gate-all-around (GAA) transistors, such as nanosheet transistors or nanowire transistors, and/or planar transistors, such as metal-oxide-semiconductor field-effect-transistors (MOSFETs). In some embodiments, the transistors include an active region, which may be a fin-shaped region of one or more three-dimensional finFETs, a sheet-shaped region of one or more GAA nanosheet transistors, a wire-shaped region of one or more GAA nanowire transistors, or an oxide-definition (OD) region of one or more planar MOSFETs. Portions of the active region may each serve as a source structure or drain structure of the respective transistor(s), and portions of the active region may each serve as a conduction channel of the respective transistor(s).

Using different backside connection schemes, different devices, such as inverters, NAND devices, AND-OR inverters, AND devices, or other suitable devices may be implemented using the same basic vertical device arrangement.

Figure 2:
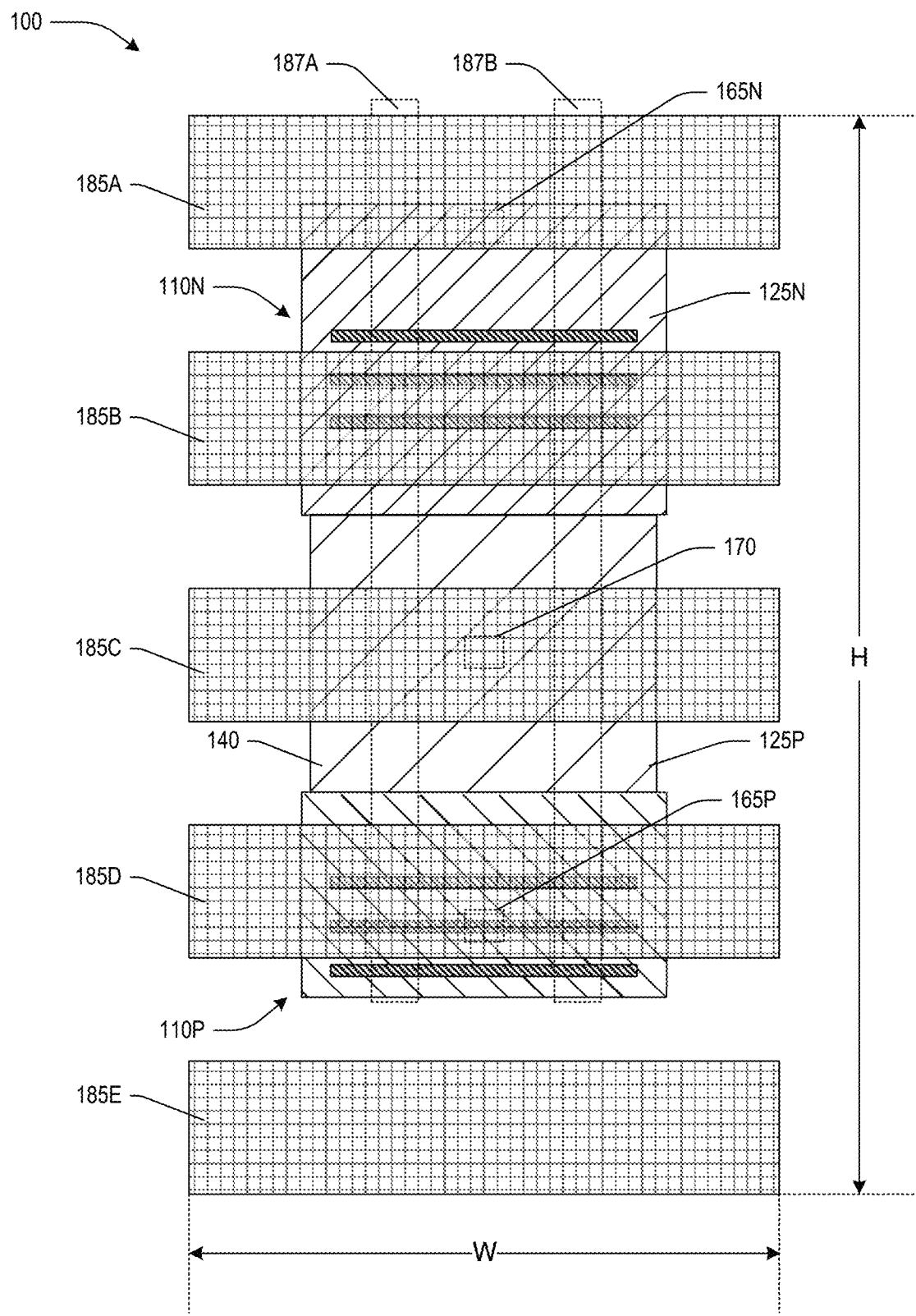
FIG. 2 is a top view of a semiconductor arrangement, in accordance with some embodiments.

Referring to FIGS. 1 and 2, a cross-section view and a top view of a semiconductor arrangement 100 comprising a unit cell 105 are provided, respectively, in accordance with some embodiments. For ease of illustration, not all of the features of the unit cell 105 are illustrated in FIG. 2. In some embodiments, the unit cell 105 comprises a first transistor 110N and a second transistor 110P formed over a semiconductor layer 115. In some embodiments, the semiconductor layer 115 is part of a substrate comprising at least one of an epitaxial layer, a single crystalline semiconductor material such as, but not limited to at least one of Si, Ge, SiGe, InGaAs, GaAs, InSb, GaP, GaSb, InAlAs, GaSbP, GaAsSb, or InP, a silicon-on-insulator (SOI) structure, a wafer, or a die formed from a wafer. In some embodiments, the semiconductor layer 115 comprises at least one of crystalline silicon or other suitable materials. Other structures and/or configurations of the semiconductor layer 115 are within the scope of the present disclosure.

In some embodiments, the first transistor 110N comprises an n-type transistor including a source pad 120N, a drain pad 125N, and nanosheets 130N extending between the source pad 120N and the drain pad 125N. In some embodiments, the source pad 120N and the drain pad 125N are doped with n-type impurities, such as phosphorous, arsenic, antimony, or some other suitable n-type dopant. In some embodiments, the nanosheets 130N are undoped or doped with a p-type impurity, such as boron, boron trifluoride, gallium, indium, or some other suitable p-type dopant.

In some embodiments, the second transistor 110P comprises a p-type transistor including a source pad 120P, a drain pad 125P, and nanosheets 130P extending between the source pad 120P and the drain pad 125P. In some embodiments, the source pad 120P and the drain pad 125P are doped with p-type impurities. In some embodiments, the nanosheets 130P are undoped or doped with an n-type impurity.

In some embodiments, the source pads 120N, 120P are formed by etching the semiconductor layer 115 to define the source pads 120N, 120P. In some embodiments, a layer of semiconductor material is deposited or grown over the semiconductor layer 115 and patterned to define the source pads 120N, 120P. In some embodiments, one or more masked implantation processes are performed to implant impurities into the source pads 120N, 120P according to the appropriate conductivity type.

In some embodiments, a shallow trench isolation (STI) structure 135 is between the source pads 120N, 120P. In some embodiments, the STI structure 135 is formed by forming at least one mask layer over a semiconductor layer to form the source pads 120N, 120P (which may by the same as the semiconductor layer 115 or a different semiconductor layer, such as a second semiconductor layer formed over the semiconductor layer 115). In some embodiments, the mask layer comprises a layer of oxide material and a layer of nitride material over the layer of oxide material, and/or one or more other suitable layers. At least some of the at least one mask layer is removed to define an etch mask for use as a template to etch the semiconductor layer used to form the source pads 120N, 120P to form a trench. A dielectric material is formed in the trench to define the STI structure 135. In some embodiments, the STI structure 135 includes multiple layers, such as an oxide liner, a nitride liner formed over the oxide liner, an oxide fill material formed over the nitride liner, and/or other suitable materials.

In some embodiments, a fill material, such as the oxide fill material, is formed using a high density (HDP) plasma process. The HDP process uses precursor gases comprising at least one of silane ($SiH_4$), oxygen, argon, or other suitable gases. The HDP process includes a deposition component, which forms material on surfaces defining the trench, and a sputtering component, which removes or relocates deposited material. A deposition-to-sputtering ratio depends on gas ratios employed during the deposition component. According to some embodiments, argon and oxygen act as sputtering sources, and the particular values of the gas ratios are determined based on an aspect ratio of the trench. After forming the fill material, an anneal process is performed to densify the fill material. In some embodiments, the STI structure 135 generate compressive stress. Other structures and/or configurations of the STI structure 135 are within the scope of the present disclosure.

In some embodiments, the nanosheets 130N, 130P are formed by forming a layer of semiconductor material over the source pads 120N, 120P and performing a patterned etch process to form the nanosheets 130N, 130P. In some embodiments, one or more masked implantation processes are performed prior to the patterned etch process to implant impurities into the semiconductor layer used to form the nanosheets 130N, 130P according to the appropriate conductivity type. In some embodiments, the nanosheets 130N, 130P have rectangular vertical and horizontal cross sections. In some embodiments, the nanosheets 130N, 130P are pillars having elliptical horizontal cross sections. As used herein, the term nanosheet is intended to encompass a structure with rectangular or elliptical horizontal cross sections.

In some embodiments, a gate pad 140 is formed around the nanosheets 130N, 130P. According to some embodiments, the gate pad 140 is formed by forming a bottom dielectric layer 145 over the source pads 120N, 120P and the STI structure 135 and forming a sacrificial gate structure comprising a sacrificial gate dielectric layer, a sacrificial layer, such as polysilicon, and a hard mask layer, such as silicon nitride, silicon dioxide, or some other suitable hard mask material, alone or in combination over the bottom dielectric layer 145. In some embodiments, a patterning process is performed to pattern the hard mask layer corresponding to the pattern of the gate pad(s) 140 to be formed, and an etch process is performed using the patterned hard mask layer to etch the sacrificial layer and the sacrificial gate dielectric layer to define the gate pad(s) 140. In some embodiments, remaining portions of the hard mask layer form a cap layer over the portions of the sacrificial layer remaining after the etch process.

In some embodiments, the gate pad(s) 140 are replacement gate structures that were formed by replacing an initially formed sacrificial gate electrode layer and a sacrificial gate electrode with a replacement gate dielectric layer and a replacement gate electrode (not separately shown). In some embodiments, a dielectric layer 150 is formed over the gate pad(s) 140 prior to the replacement of the sacrificial materials. In some embodiments, the dielectric layer 150 comprises one or more layers of low-k dielectric material. Low-k dielectric materials have a k-value (dielectric constant) lower than about 3.9. Some low-k dielectric materials have a k-value lower than about 3.5 and may have a k-value lower than about 2.5. A low-k layer is, in some embodiments, further characterized or classified as ultra low-K (ULK), extra low-K (ELK), or extreme low-k (XLK), where the classification is generally based upon the k-value. For example, ULK generally refers to materials with a k-value of between about 2.7 to about 2.4, ELK generally refers to materials with a k-value of between about 2.3 to about 2.0, and XLK generally refers to materials with a k-value of less than about 2.0. In some embodiments, the dielectric layer 150 comprises silicon dioxide and/or other suitable materials. In some embodiments, the material(s) for the dielectric layer 150 comprises at least one of Si, O, C, or H, such as SiCOH, SiOC, oxygen-doped SiC (ODC), nitrogen-doped SiC (NDC), plasma-enhanced oxide (PEOX), and/or other suitable materials. Organic material, such as polymers, may be used for the dielectric layer 150. In some embodiments, the dielectric layer 150 comprises one or more layers of a carbon-containing material, organo-silicate glass, a porogen-containing material, and/or other suitable materials. The dielectric layer 150 comprises nitrogen in some embodiments. In some embodiments, the dielectric layer 150 is formed by using, for example, at least one of atomic layer deposition (ALD), chemical vapor deposition (CVD), low pressure CVD (LPCVD), atomic layer chemical vapor deposition (ALCVD), ultrahigh vacuum CVD (UHVCVD), reduced pressure CVD (RPCVD), plasma enhanced CVD (PECVD), or other suitable techniques. In some embodiments, the dielectric layer 150 comprises one or more layers, at least some of which may have a same material composition. In some embodiments, there are one or more layers of the dielectric layer 150, at least some of which may have a same material composition. Other structures and/or configurations of the dielectric layer 150 are within the scope of the present disclosure.

In some embodiments, where the gate pad(s) 140 are replacement gate structures, the replacement gate dielectric layer comprises a high-k dielectric material. As used herein, the term "high-k dielectric" refers to the material having a dielectric constant, k, greater than or equal to about 3.9, which is the k-value of $SiO_2$. The material of the high-k dielectric layer may comprise any suitable materials. Examples of the material of the high-k dielectric layer include, but are not limited to, $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, an alloy thereof and/or other suitable materials. Each value of x is independently from 0.5 to 3, and each value of y is independently from 0 to 2. In some embodiments, the gate dielectric layer comprises a native oxide layer formed by exposure of the semiconductor arrangement 100 to oxygen at various points in the process flow, causing the formation of silicon dioxide on exposed surfaces. In some embodiments, an additional layer of dielectric material, such as comprising silicon dioxide, a high-k dielectric material, and/or other suitable materials, is formed over the native oxide to form the gate dielectric layer.

In some embodiments, where the gate pad(s) 140 are replacement gate structures the replacement gate electrode comprises a barrier layer, one or more work function material layers, a seed layer, a metal fill layer, and/or other suitable layers. In some embodiments, the metal fill layer comprises tungsten, aluminum, copper, cobalt, and/or other suitable materials. In some embodiments, the gate dielectric layer and/or the one or more layers that comprise the gate electrode are formed by at least one of ALD, physical vapor deposition (PVD), CVD, LPCVD, ALCVD, UHVCVD, RPCVD, molecular beam epitaxy (MBE), or other suitable techniques. In some embodiments, the replacement gate electrode is recessed and a top dielectric layer 155 is formed over the gate pad 140.

In some embodiments, the drain pads 125N, 125P are formed by forming a layer of semiconductor material over the gate pad 140 and the dielectric layer 150 and patterning the layer of semiconductor material to define the drain pads 125N, 125P. In some embodiments, one or more masked implantation processes are performed to implant impurities in the drain pads 125N, 125P according to the appropriate conductivity type. In some embodiments, during the patterning process to define the drain pads 125N, 125P, a central portion 140CT of the gate pad 140 is recessed relative to end portions 140E. In some embodiments, a dielectric layer 160 is formed over the dielectric layer 150, the drain pads 125N, 125P, and the central portion 140CT of the gate pad 140. In some embodiments, a material of the dielectric layer 160 is the same as the material of the dielectric layer 150.

In some embodiments, drain contacts 165N, 165P and a gate contact 170 are formed in the dielectric layer 160. The drain contacts 165N, 165P and the gate contact 170 are formed in any number of ways, such as by a single damascene process, a dual damascene process, a trench silicide process, and/or other suitable techniques. In some embodiments, the drain contacts 165N, 165P and the gate contact 170 comprise a barrier layer, a seed layer, a metal fill layer, and/or other suitable layers. In some embodiments, the metal fill layer comprises tungsten, aluminum, copper, cobalt, and/or other suitable materials. Other structures and/or configurations of the drain contacts 165N, 165P and the gate contact 170 are within the scope of the present disclosure.

In some embodiments, a dielectric layer 180 is formed over the dielectric layer 160, the drain contacts 165N, 165P, and the gate contact 170, and conductive lines 185A, 185B, 185C, 185D, 185E are formed in the dielectric layer 180. In some embodiments, the dielectric layer 180 and the conductive lines 185A, 185B, 185C, 185D, 185E define a first metallization layer, M0, of the semiconductor arrangement 100. In some embodiments, the dielectric layer 180 comprises a same material as the dielectric layer 150 or the dielectric layer 160. In some embodiments, additional metallization layers are formed above the dielectric layer 180 and the conductive lines 185A, 185B, 185C, 185D, 185E to form various interconnections between the unit cell 105 and the other devices formed in the semiconductor arrangement 100. For example, as illustrated in FIG. 2, conductive lines 187A, 187B in the M1 metallization layer are formed over the conductive lines 185A, 185B, 185C, 185D, 185E in a subsequent metallization layer. In some embodiments, selected conductive lines of the conductive lines 185A, 185B, 185C, 185D, 185E comprise power rails for providing a supply voltage, $V_{DD}$, and/or a reference voltage, $V_{SS}$, to the unit cell 105.

In some embodiments, backside connections to the unit cell 105 are facilitated by backside contacts 190A, 190B, backside conductive lines 195A, 195B, and a backside interconnect line 200. In some embodiments, a sidewall spacer 205A, 205B is between the backside conductive lines 195A, 195B and the semiconductor layer 115. In some embodiments, a dielectric layer 210 is formed under the semiconductor layer 115, and the backside conductive lines 195A, 195B are formed in trenches formed in the dielectric layer 210. In some embodiments, the dielectric layer 210 and the backside conductive lines 195A, 195B define a backside M0 metallization layer. In some embodiments, a spacer layer 215 is between the backside interconnect line 200 and the source pads 120P, 120N. In some embodiments, a cap layer 220A, 220B is between the backside contacts 190A, 190B and the backside conductive lines 195A, 195B. In some embodiments, a cap layer 225 is between the backside interconnect line 200 and the backside conductive lines 195A, 195B. In some embodiments, the cap layers 220A, 220B, 225 comprise a dielectric material, including materials such as silicon, nitrogen, carbon, oxygen, or other suitable materials. Is a material of the cap layers 220A, 220B is different than a material of the cap layer 225.

The unit cell 105 illustrated in FIG. 1 may be configured or combined with other unit cells 105 to realize different logic devices. Different configurations of the backside interconnections may be provided based on the particular logic device being implemented. For example, in some embodiments, the backside conductive lines 195A, 195B comprise power rails for providing $V_{DD}$ and/or $V_{SS}$ to the unit cell 105. One or both of the cap layers 220A, 220B may be omitted to connect the backside conductive line 195A, 195B to the respective backside contact 190A, 190B. One or more of the backside contacts 190A, 190B may be omitted. One or more of the sidewall spacers 205A, 205B may be partially removed to connect one or both of the backside contacts 190A, 190B to the backside interconnect line 200. In some embodiments, a backside gate contact 230 is provided to connect the backside interconnect line 200 to the gate pad 140.

Referring to FIG. 1, in some embodiments, a vertical height of the nanosheets 130N, 130P is about 12.5-60 nm, referred to as the nanosheet height (NSH). A vertical height of the drain contacts 165N, 165P is about (0.5-2.5)*NSH. A vertical height of the drain pads 125N, 125P is about (1-3)*NSH. A vertical height of the source pads 120N, 120P is about (1-2)*NSH. A vertical height of the gate contact 170 is about (the height of the drain contacts 165N, 165P+ the height of the drain pad 125N, 125+(0.7-1)*NSH).

Referring to FIG. 2, in some embodiments, a pitch of the M0 conductive lines 185A, 185B, 185C, 185D, 185E is about 20 nm. A pitch of the M1 conductive lines 187A, 187B is about 26 nm. A height, H, of the unit cell 105 is about 5 times the M0 pitch or 100 nm and a width, W, of the unit cell 105 is about 2 times the M1 pitch or 52 nm.

FIGS. 3A-3I are cross-section views of a semiconductor arrangement at various stages of fabrication, in accordance with some embodiments. FIGS. 3A-3I illustrate a semiconductor wafer on which the semiconductor arrangement 100 is formed inverted to allow for formation of the backside interconnects.

Figure 3A:
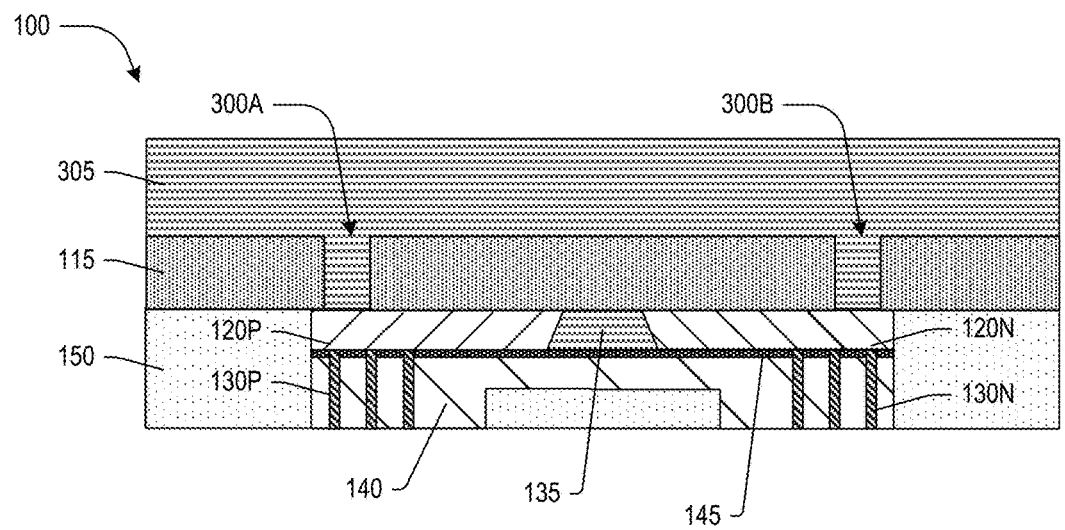
FIGS. 3A-3I are cross-section views of a semiconductor arrangement at various stages of fabrication, in accordance with some embodiments.

Referring to FIG. 3A, contact openings 300A, 300B are formed in the semiconductor layer 115 and a dielectric layer 305 is formed over the semiconductor layer 115 and in the contact openings 300A, 300B, according to some embodiments. In some embodiments, the contact openings 300A, 300B are formed by forming at least one mask layer over the semiconductor layer 115. In some embodiments, the mask layer comprises a layer of oxide material over the semiconductor layer 115 and a layer of nitride material over the layer of oxide material, and/or one or more other suitable layers. At least some of the mask layer is removed to define an etch mask for use as a template to etch the semiconductor layer 115 to form the contact openings 300A, 300B. In some embodiments, the dielectric layer 305 comprises silicon dioxide, a low-k material, and/or other suitable materials. In some embodiments, the material(s) for the dielectric layer 305 comprises at least one of Si, 0, C, or H, such as SiCOH, SiOC, ODC, NDC, PEOX, and/or other suitable materials. Organic material such as polymers may be used for the dielectric layer 305. In some embodiments, the dielectric layer 305 comprises one or more layers of a carbon-containing material, organo-silicate glass, a porogen-containing material, and/or other suitable materials. The dielectric layer 305 comprises nitrogen in some embodiments. In some embodiments, the dielectric layer 305 is formed by using, for example, at least one of CVD, PECVD, LPCVD, ALCVD, a spin-on technology, or other suitable techniques. In some embodiments, the dielectric layer 305 comprises one or more layers, at least some of which may have a same material composition. In some embodiments, there are one or more layers of the dielectric layer 305, at least some of which may have a same material composition. Other structures and/or configurations of the dielectric layer 305 are within the scope of the present disclosure.

Figure 3B:
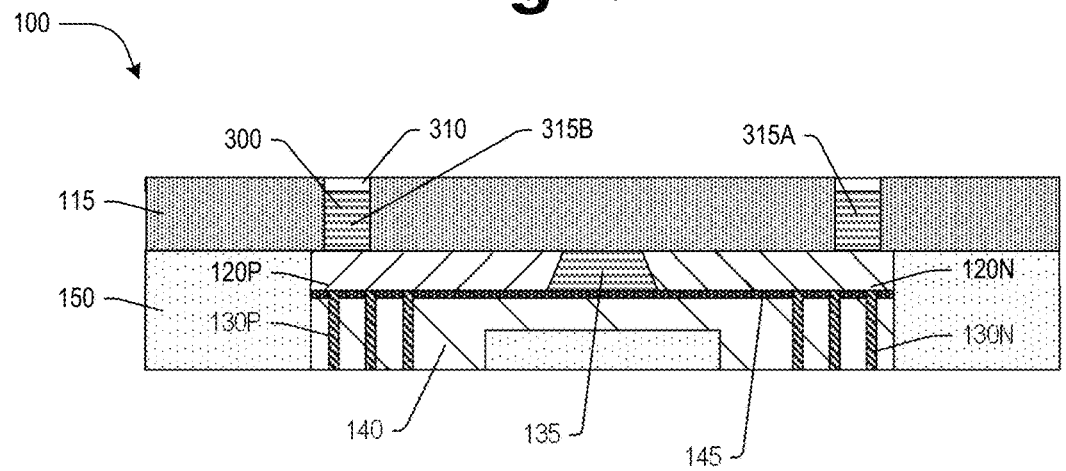

Referring to FIG. 3B, the dielectric layer 305 is recessed, and a cap layer 310 is formed in a top portion of the contact openings 300A, 300B, according to some embodiments. In some embodiments, a planarization process is performed to remove portions of the dielectric layer 305 over the semiconductor layer 115, and an etch process is performed to recess the dielectric layer 305. In some embodiments, the cap layer 310 comprises a dielectric material, including materials such as silicon, nitrogen, carbon, oxygen, or other suitable materials. In some embodiments, the cap layer 310 is formed by depositing a material layer over the semiconductor layer 115 and in the recesses and performing a planarization process to remove portions of the material layer outside the recesses. The remaining portions of the dielectric layer 305 define dummy contacts 315A, 315B.

Figure 3C:
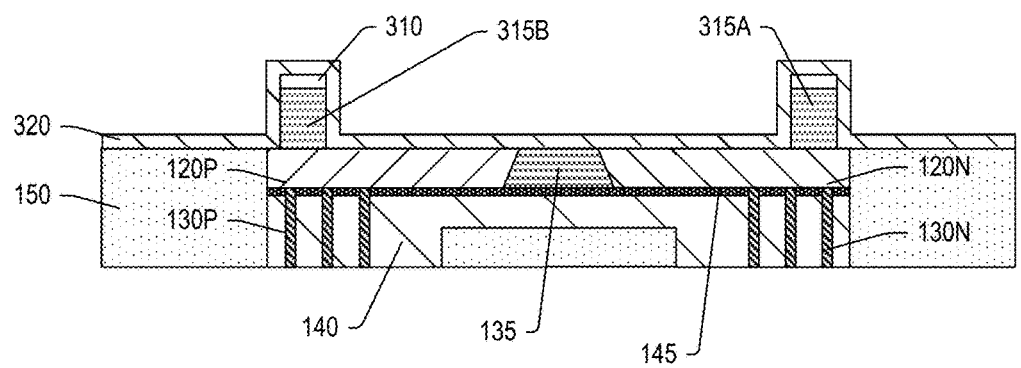

Referring to FIG. 3C, the semiconductor layer 115 is removed and a spacer layer 320 is formed over the cap layer 310 and the dielectric layer 150, according to some embodiments. In some embodiments, an etch process is performed to remove the semiconductor layer 115. In some embodiments, the spacer layer 320 is formed by at least one of CVD, PECVD, LPCVD, ALCVD, a spin-on technology, or other suitable techniques. In some embodiments, the spacer layer 320 comprises a dielectric material, including materials such as silicon, nitrogen, carbon, oxygen, or other suitable materials. In some embodiments, a material composition of the spacer layer 320 differs from a material composition of the cap layer 310 to facilitate selective removal of the spacer layer 320 without removing the cap layer 310.

Figure 3D:
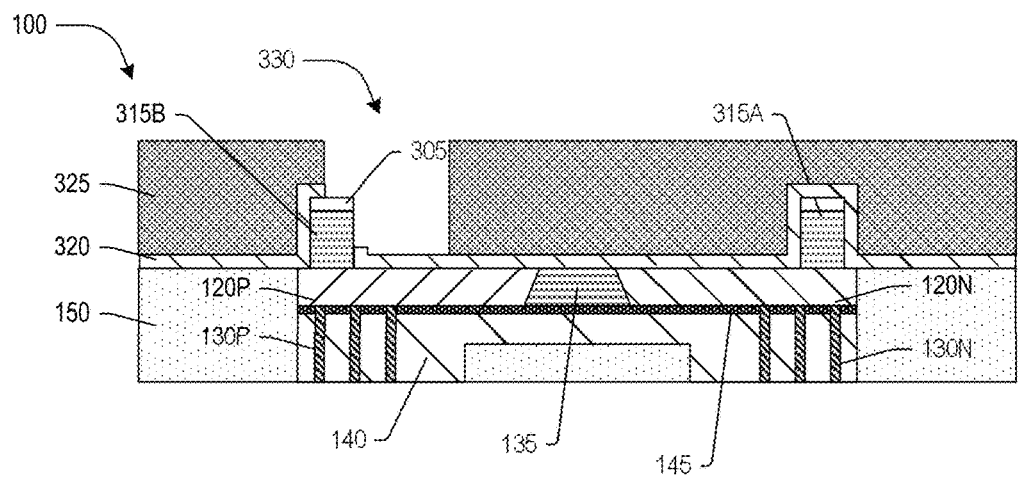

Referring to FIG. 3D, a mask 325 is formed over the spacer layer 320, and a portion of the spacer layer 320 exposed by the mask 325 is removed, according to some embodiments. The mask 325 comprises an opening 330 exposing a portion of the dummy contact 315B. In some embodiments, the mask 325 comprises photoresist or some other suitable mask material. In some embodiments, an etch process is performed using the mask 325 as an etch template to remove a portion of the spacer layer 320 and expose a portion of the dummy contact 315B. In some embodiments, an angled etch process performed to remove an upper portion of the spacer layer 320 while leaving a lower portion of the spacer layer 320 in place over the source pad 120P to provide electrical isolation. In some embodiments, using a process referred to as chamfering, a sacrificial material is provided in the bottom of the opening 330 to protect the bottom portion of the spacer layer 320 during the etching process, and the sacrificial material is later removed.

Figure 3E:
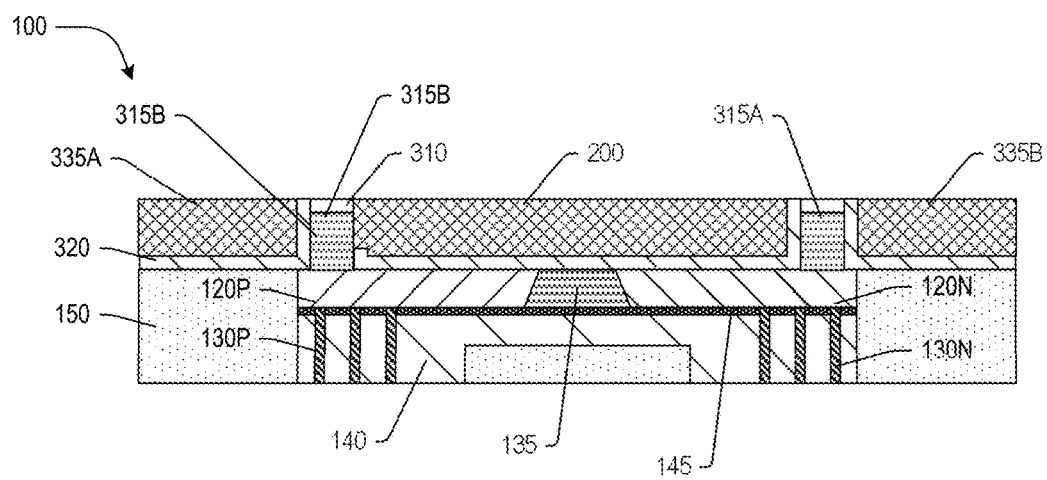

Referring to FIG. 3E, the mask 325 is removed, and the backside interconnect line 200 is formed between the dummy contacts 315A, 315B, according to some embodiments. Backside interconnect lines 335A, 335B are associated with adjacent unit cells 105 (not illustrated in FIG. 1). In some embodiments, the backside interconnect lines 200, 335A, 335B comprise tungsten, aluminum, copper, cobalt, and/or other suitable materials. In some embodiments, the backside interconnect lines 200, 335A, 335B are formed by depositing a conductive material over the dummy contacts 315A, 315B and planarizing the conductive material to remove portions of the conductive material over the cap layer 310. In some embodiments, the planarization process also removes portions of the spacer layer 320 over the cap layer 310.

Figure 3F:
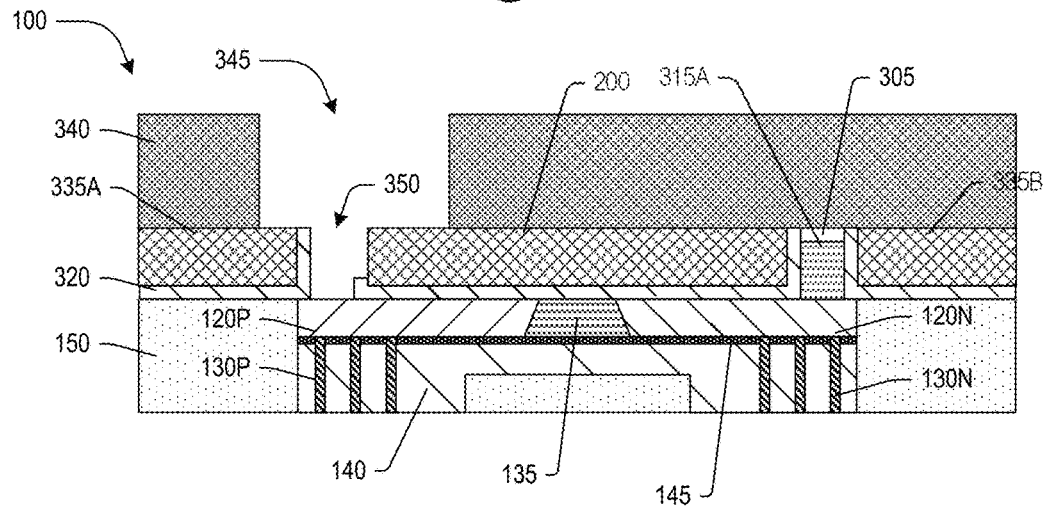

Referring to FIG. 3F, a mask 340 is formed over the backside interconnect lines 200, 335A, 335B, and the cap layer 310 over the dummy contact 315B is removed, according to some embodiments. The mask 340 comprises an opening 345 exposing the cap layer 310 and the dummy contact 315B. In some embodiments, the mask 340 comprises photoresist or some other suitable mask material. In some embodiments, an etch process is performed using the mask 340 as an etch template to remove the cap layer 310 and the dummy contact 315B to define a recess 350.

Figure 3G:
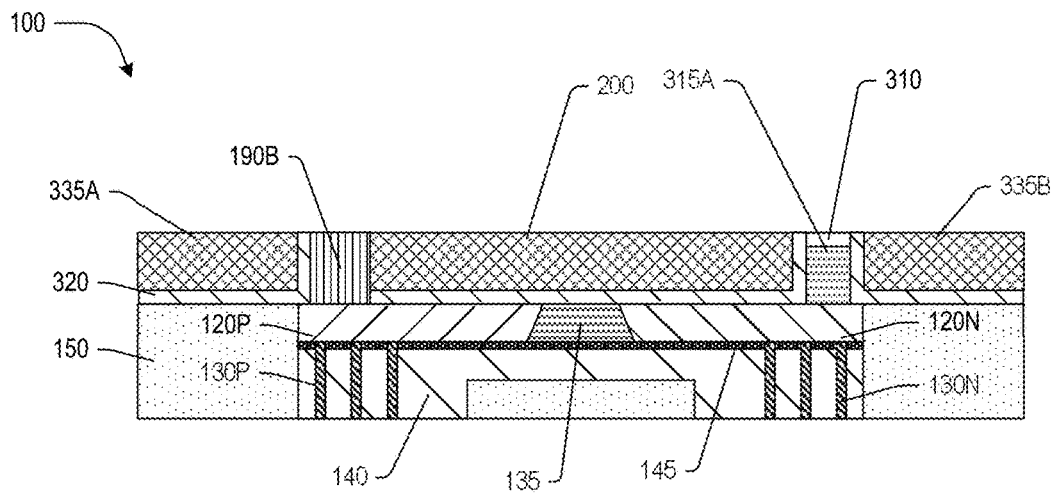

Referring to FIG. 3G, the mask 340 is removed, and the backside contact 190B is formed in the recess 350, according to some embodiments. In some embodiments, the backside contact 190B comprises tungsten, aluminum, copper, cobalt, and/or other suitable materials. In some embodiments, the backside contact 190B is formed by depositing a conductive material in the recess 350 and planarizing the conductive material to remove portions of the conductive material outside the recess 350.

Figure 3H:
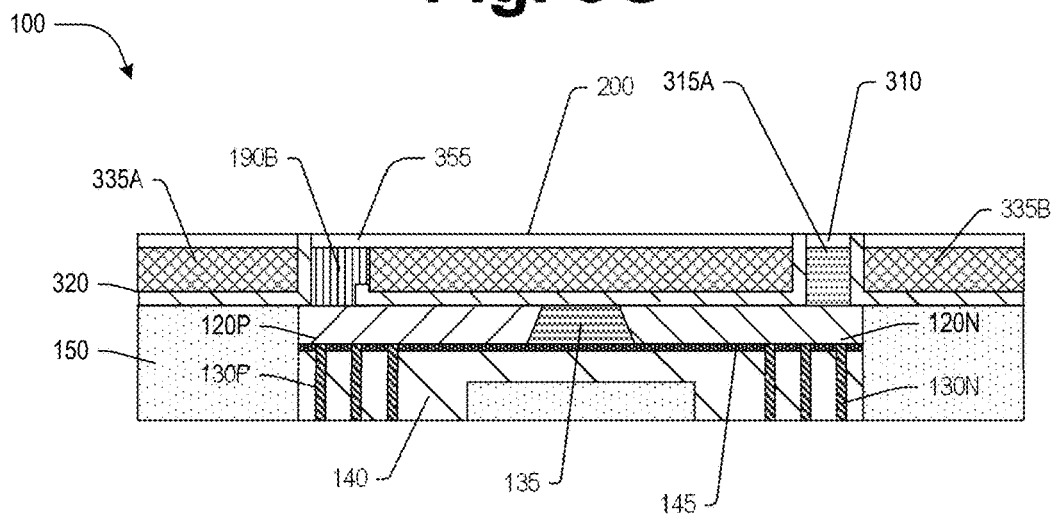

Referring to FIG. 3H, the backside contact 190B and the backside interconnect lines 200, 335A, 335B are recessed to define a recess, and a cap layer 355 is formed in the recess, according to some embodiments. In some embodiments, an etch process is performed to recess the backside contact 190B and the backside interconnect lines 200, 335A, 335B. In some embodiments, the cap layer 355 comprises the same material as the cap layer 310. In some embodiments, the cap layer 355 is formed by depositing a material layer over the backside contact 190B and the backside interconnect lines 200, 335A, 335B and performing a planarization process to remove portions of the material layer outside the recesses in the backside contact 190B and the backside interconnect lines 200, 335A, 335B.

Figure 3I:
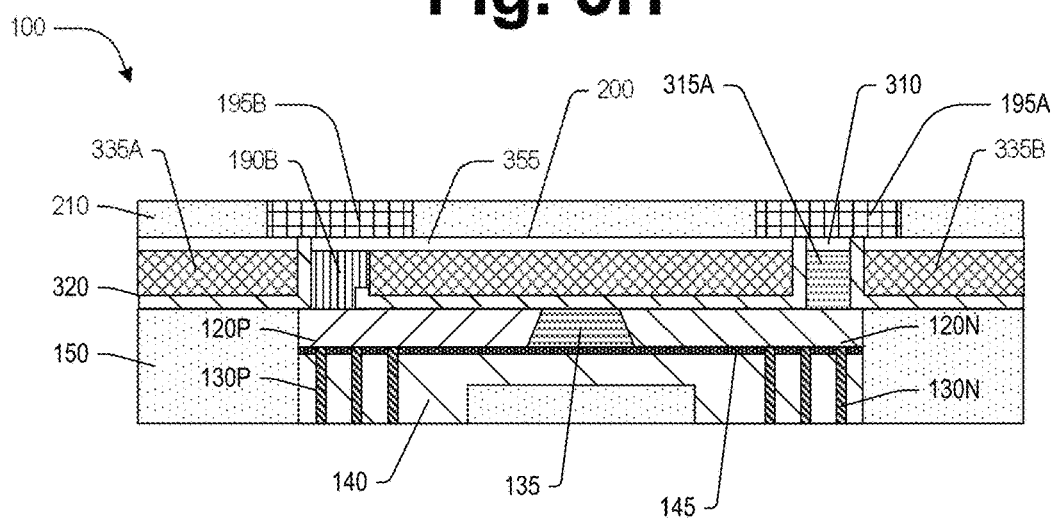

Referring to FIG. 3I, the dielectric layer 210 and the backside conductive lines 195A, 195B are formed, according to some embodiments. In some embodiments, the backside conductive lines 195B is isolated from the backside contact 190B and the backside interconnect lines 200, 335A, 335B by the cap layer 355. The backside contact 190B contacts the backside interconnect line 200.

In some embodiments, the dummy contact 315A remains in place because a backside contact is not employed in the logic device created from the unit cell 105. In some embodiments, both dummy contacts 315A, 315B are replaced using the steps of FIGS. 3D-3I such that the backside interconnect line 200 contacts the backside contact 190B and a backside contact (not shown) formed by removing a portion of the spacer layer 320 and replacing the dummy contact 315A.

FIGS. 4A-4E are cross-section views of a semiconductor arrangement at various stages of fabrication, in accordance with some embodiments. FIGS. 4A-4E illustrate the semiconductor wafer on which the semiconductor arrangement 100 is formed inverted to allow for formation of the backside interconnects. The processing of FIGS. 4A-4E starts with the semiconductor arrangement 100 illustrated in FIG. 3C.

Figure 4A:
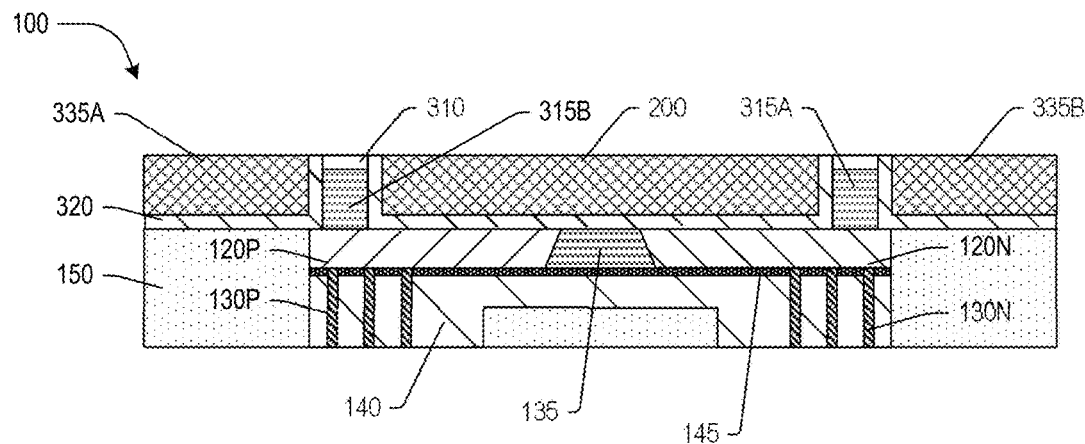
FIGS. 4A-4E are cross-section views of a semiconductor arrangement at various stages of fabrication, in accordance with some embodiments.

Referring to FIG. 4A, the backside interconnect lines 200, 335A, 335B are formed adjacent the dummy contacts 315A, 315B, according to some embodiments. In some embodiments, the backside interconnect lines 200, 335A, 335B comprises tungsten, aluminum, copper, cobalt, and/or other suitable materials. In some embodiments, the backside interconnect lines 200, 335A, 335B are formed by depositing a conductive material over the dummy contacts 315A, 315B and planarizing the conductive material to remove portions of the conductive material over the cap layer 310. In some embodiments, the planarization process also removes portions of the spacer layer 320 over the cap layer 310.

Figure 4B:
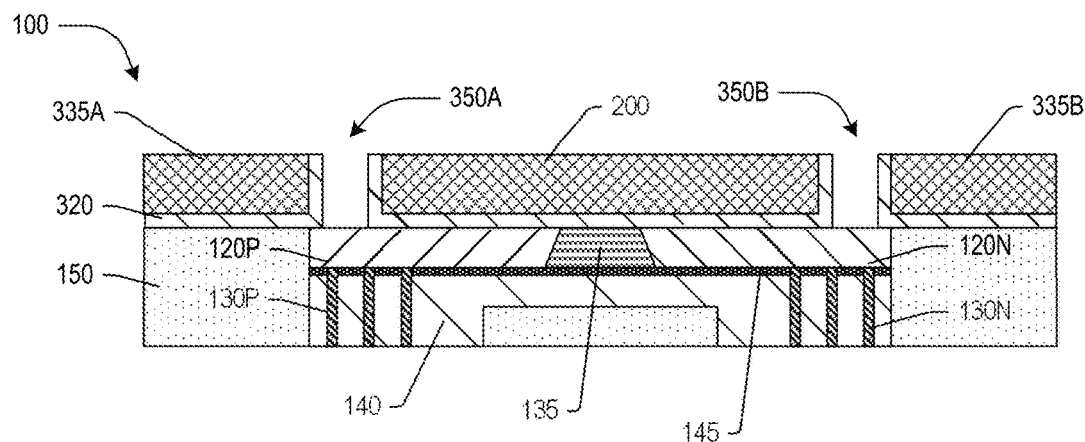

Referring to FIG. 4B, the dummy contacts 315A, 315B are removed, according to some embodiments. In some embodiments, an etch process is performed to remove the cap layer 310 and the dummy contacts 315A, 315B to define recesses 350A, 350B.

Figure 4C:
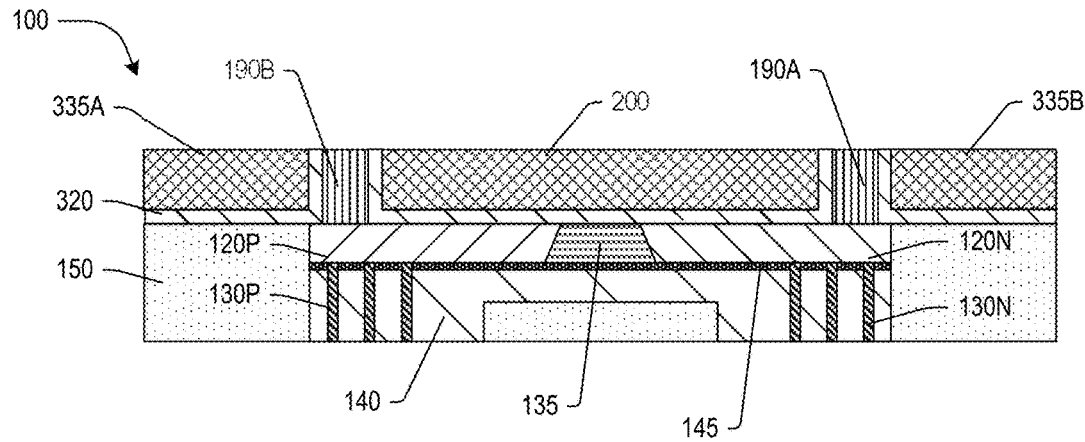

Referring to FIG. 4C, the backside contacts 190A, 190B are formed in the recesses 350A, 350B, according to some embodiments. In some embodiments, the backside contacts 190A, 190B comprises tungsten, aluminum, copper, cobalt, and/or other suitable materials. In some embodiments, the backside contacts 190A, 190B are formed by depositing a conductive material in the recesses 350A, 350B and planarizing the conductive material to remove portions of the conductive material outside the recesses 350A, 350B.

Figure 4D:
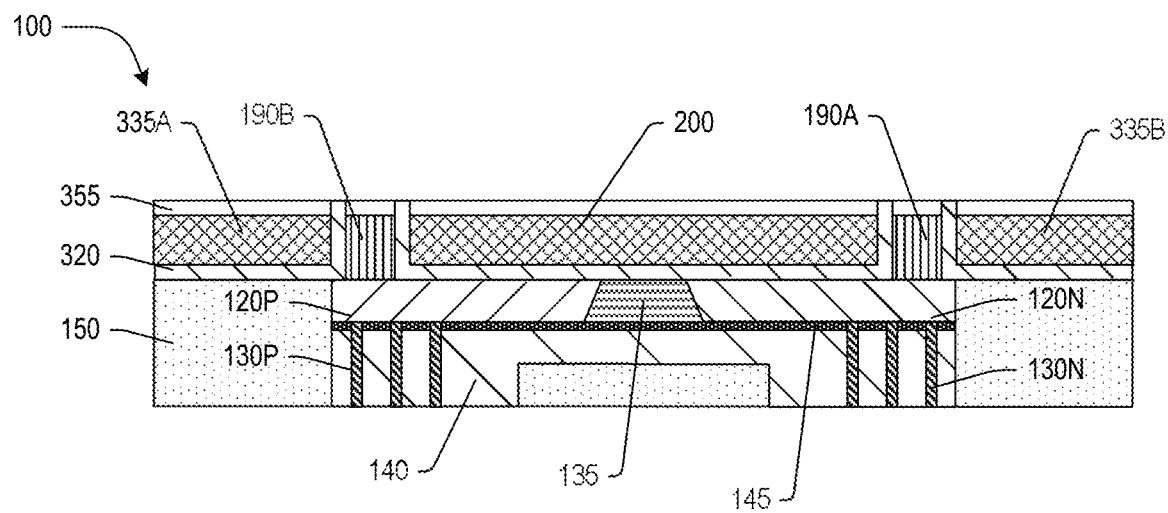

Referring to FIG. 4D, the backside contacts 190A, 190B and the backside interconnect lines 200, 335A, 335B are recessed, and the cap layer 355 is formed, according to some embodiments. In some embodiments, an etch process is performed to recess the backside contacts 190A, 190B and the backside interconnect lines 200, 335A, 335B. In some embodiments, the cap layer 355 comprises the same material as the cap layer 310. In some embodiments, the cap layer 355 is formed by depositing a material layer over the backside contacts 190A, 190B and the backside interconnect lines 200, 335A, 335B and performing a planarization process to remove portions of the material layer outside the recesses in the backside contacts 190A, 190B and the backside interconnect lines 200, 335A, 335B.

Figure 4E:
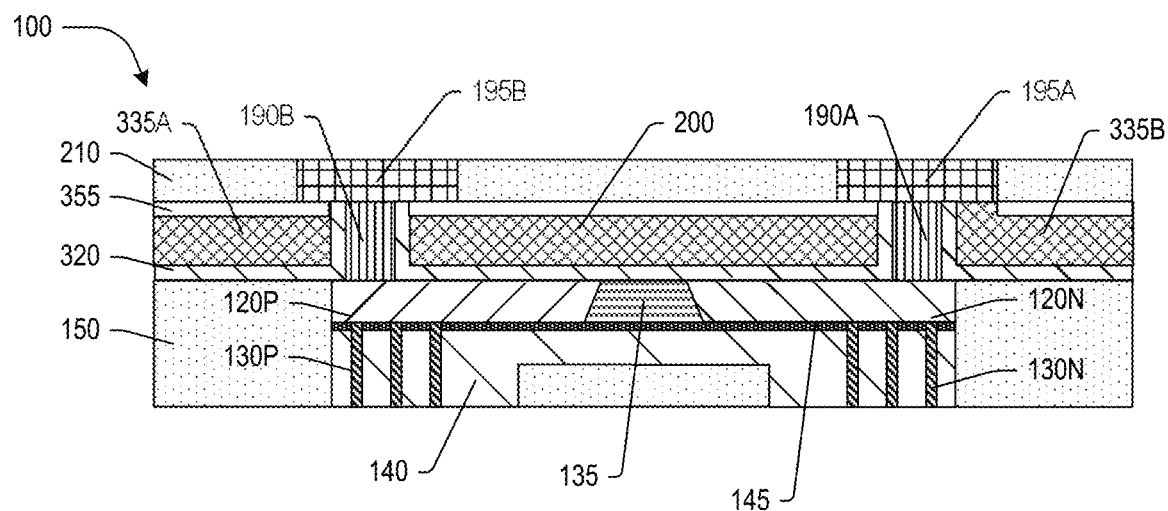

Referring to FIG. 4E, the dielectric layer 210 and the backside conductive lines 195A, 195B are formed, according to some embodiments. In some embodiments, the backside contacts 190A, 190B contact the backside conductive lines 195A, 195B and the source pads 120N, 120P and the backside interconnect line 200 is isolated from the backside contacts 190A, 190B by the spacer layer 320.

FIGS. 5A-5D are cross-section views of a semiconductor arrangement at various stages of fabrication, in accordance with some embodiments. FIGS. 5A-5D illustrate the semiconductor wafer on which the semiconductor arrangement 100 is formed inverted to allow for formation of the backside interconnects. The processing of FIGS. 5A-5D starts with the semiconductor arrangement 100 illustrated in FIG. 3C.

Figure 5A:
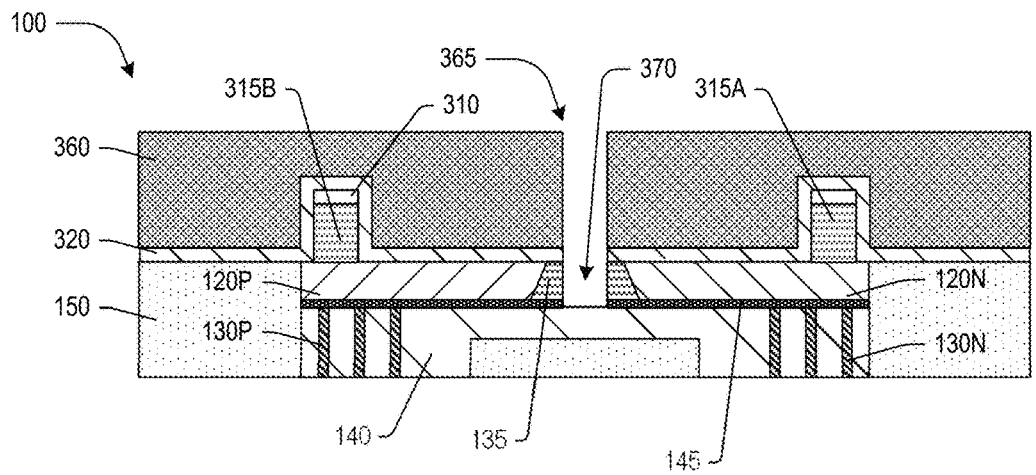
FIGS. 5A-5D are cross-section views of a semiconductor arrangement at various stages of fabrication, in accordance with some embodiments.

Referring to FIG. 5A, a mask 360 is formed over the spacer layer 320 and the dummy contacts 315A, 315B and portions of the spacer layer 320, the STI structure 135, and the bottom dielectric layer 145 are removed, according to some embodiments. In some embodiments, the mask 360 comprises an opening 365 over the STI structure 135. In some embodiments, the mask 360 comprises photoresist or some other suitable mask material. In some embodiments, an etch process is performed using the mask 360 as an etch template to remove the portions of the spacer layer 320, the STI structure 135, and the bottom dielectric layer 145 to define a gate contact opening 370.

Figure 5B:
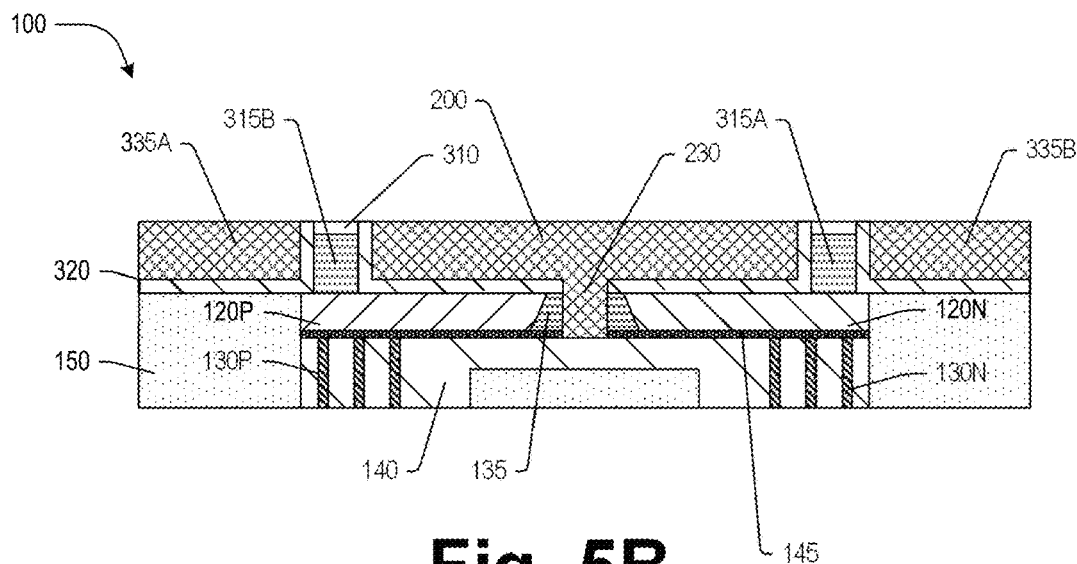

Referring to FIG. 5B, the mask 340 is removed, the backside gate contact 230 is formed in the gate contact opening 370, and the backside interconnect lines 200, 335A, 335B are formed adjacent the dummy contacts 315A, 315B, according to some embodiments. In some embodiments, the backside gate contact 230 and the backside interconnect lines 200, 335A, 335B comprise tungsten, aluminum, copper, cobalt, and/or other suitable materials. In some embodiments, the backside gate contact 230 and the backside interconnect lines 200, 335A, 335B are formed by depositing a conductive material in the gate contact opening 370 and adjacent the dummy contacts 315A, 315B and planarizing the conductive material to remove portions of the conductive material over the dummy contacts 315A, 315B. In some embodiments, the planarization process also removes portions of the spacer layer 320 over the cap layer 310.

Figure 5C:
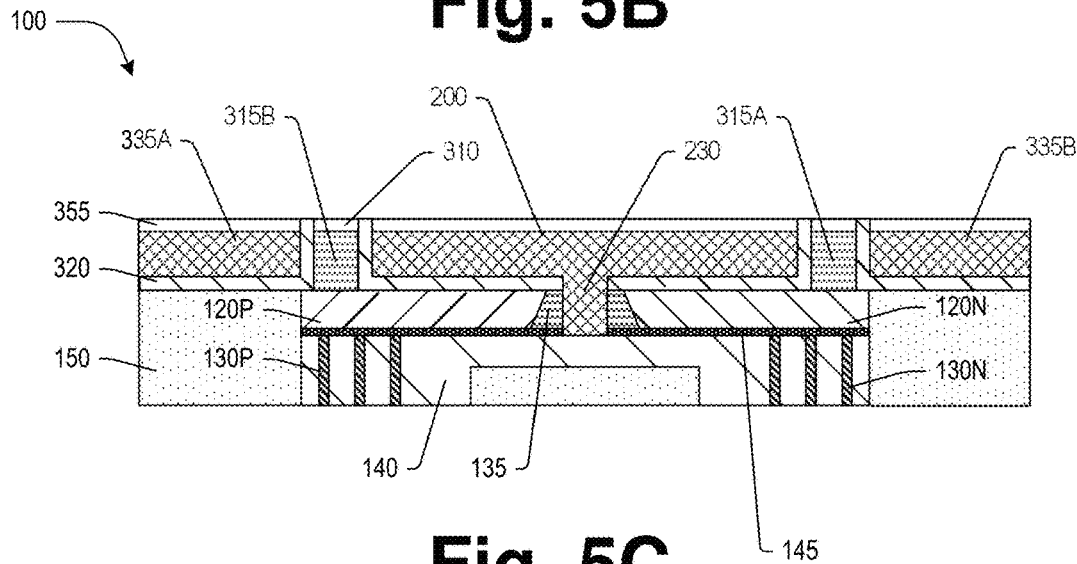

Referring to FIG. 5C, the backside interconnect lines 200, 335A, 335B are recessed, and the cap layer 355 is formed, according to some embodiments. In some embodiments, an etch process is performed to recess the backside interconnect lines 200, 335A, 335B. In some embodiments, the cap layer 355 comprises the same material as the cap layer 310. In some embodiments, the cap layer 355 is formed by depositing a material layer over the backside interconnect lines 200, 335A, 335B and performing a planarization process to remove portions of the material layer outside the recesses in the backside interconnect lines 200, 335A, 335B. In some embodiments, the dummy contacts 315A, 315B remain in place because backside contacts are not employed in the logic device created from the unit cell 105.

Figure 5D:
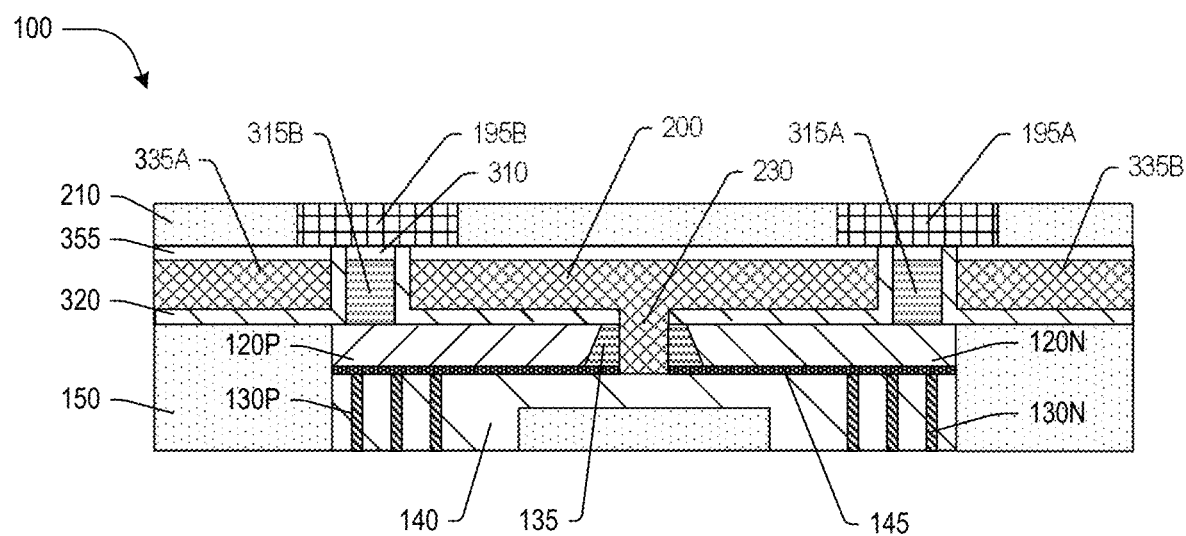

Referring to FIG. 5D, the dielectric layer 210 and the backside conductive lines 195A, 195B are formed, according to some embodiments. In some embodiments, the backside interconnect line 200 is isolated from the backside contacts 190A, 190B by the cap layer 355. In some embodiments, the backside gate contact 230 contacts the backside interconnect line 200.

The processes of FIGS. 3A-3I, FIGS. 4A-4E, and FIGS. 5A-5D may be employed to provide different backside interconnections to support various logic device configurations.

Figure 6A:
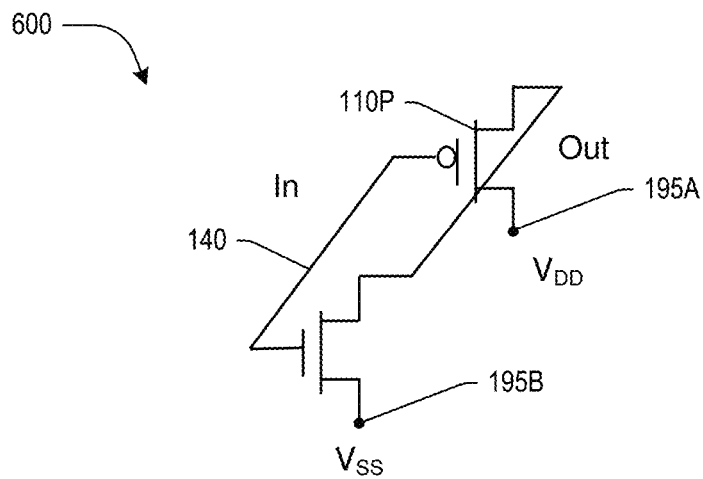
FIGS. 6A, 6B, 7A, 7B, 8A, 8B, 9A, 9B illustrate logic devices, in accordance with some embodiments.
Figure 6B:
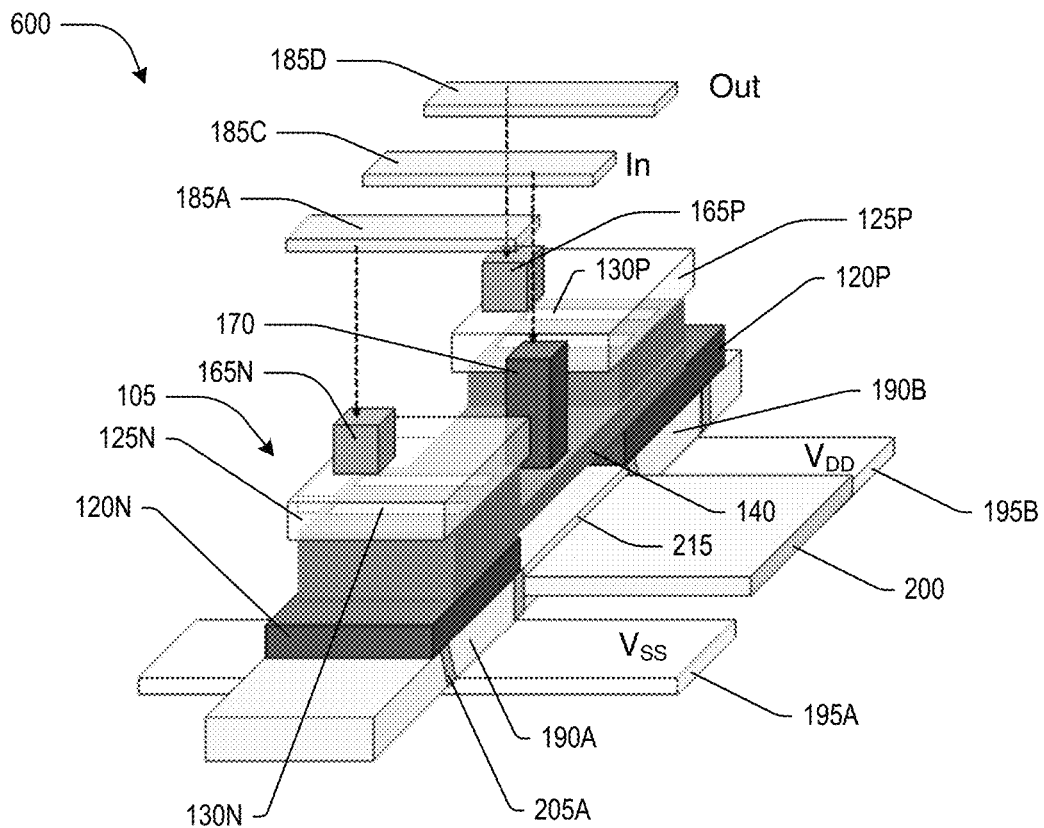

Referring to FIGS. 6A and 6B, a circuit diagram and a simplified isometric view of an inverter 600 is provided, according to some embodiments. In some embodiments, the inverter 600 is implemented using one unit cell 105. The unit cell 105 illustrated in FIG. 6B is simplified for ease of illustration. In accordance with the processing illustrated in FIGS. 4A-4E, the backside contacts 190A, 190B are connected to the backside conductive lines 195A, 195B and $V_{SS}$ and $V_{DD}$ are provided to the unit cell 105 via the backside conductive lines 195A, 195B, respectively. The conductive lines 185A, 185D are connected to one another in an overlying metallization layer. An input of the inverter 600 is received via the conductive line 185C, and an output of the inverter 600 is present on the interconnected conductive lines 185A, 185D.

Figure 7A:
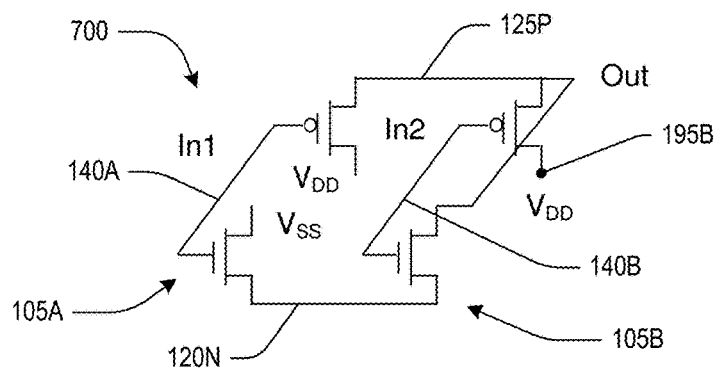
Figure 7B:
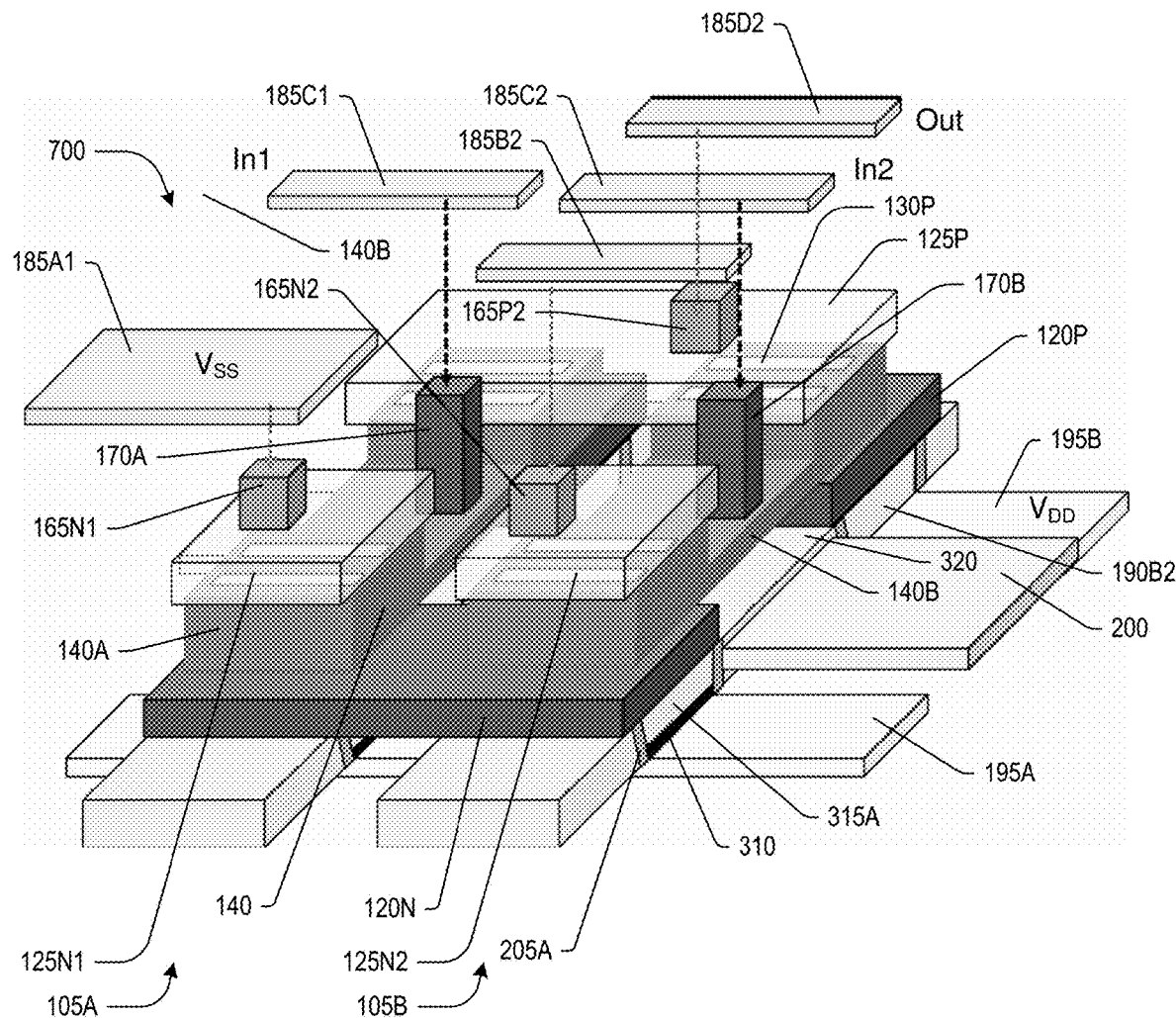

Referring to FIGS. 7A and 7B, a circuit diagram and a simplified isometric view of a two-input NAND gate 700 is provided, according to some embodiments. In some embodiments, the two-input NAND gate 700 is implemented using two unit cells 105A, 105B. The unit cells 105A, 105B illustrated in FIG. 7B are simplified for ease of illustration. The unit cells 105A, 105B have a shared source pad 120N and a shared drain pad 125P. In accordance with the processing illustrated in FIGS. 4A-4E, the backside contact 190B2 of the unit cells 105B and the backside contact (not visible) of the unit cell 105A are connected to the backside conductive line 195B and $V_{DD}$ is provided to the unit cells 105A, 105B via the backside conductive line 195B. A conductive line 185A1 provides VSS to the drain pad 125N1 of the unit cell 105A via drain contact 165N. A conductive line 185B2 is coupled to the drain pad 125N2 of the second unit cell 105B via drain contact 165N2. A conductive line 185D2 is coupled to the drain pad 125P via drain contact 165P2. The conductive lines 185B2, 185D2 are connected to one another in an overlying metallization layer. A conductive line 185C1 connects to the gate pad 140A of the unit cell 105A via gate contact 170A. A conductive line 185C2 connects to the gate pad 140B of the unit cell 105B via gate contact 170B. Inputs, In1, In2 of the two-input NAND gate 700 are received via conductive lines 185C1, 185C2, and an output of the two-input NAND gate 700 is provided on the interconnected conductive lines 185B2, 185D2.

Figure 8A:
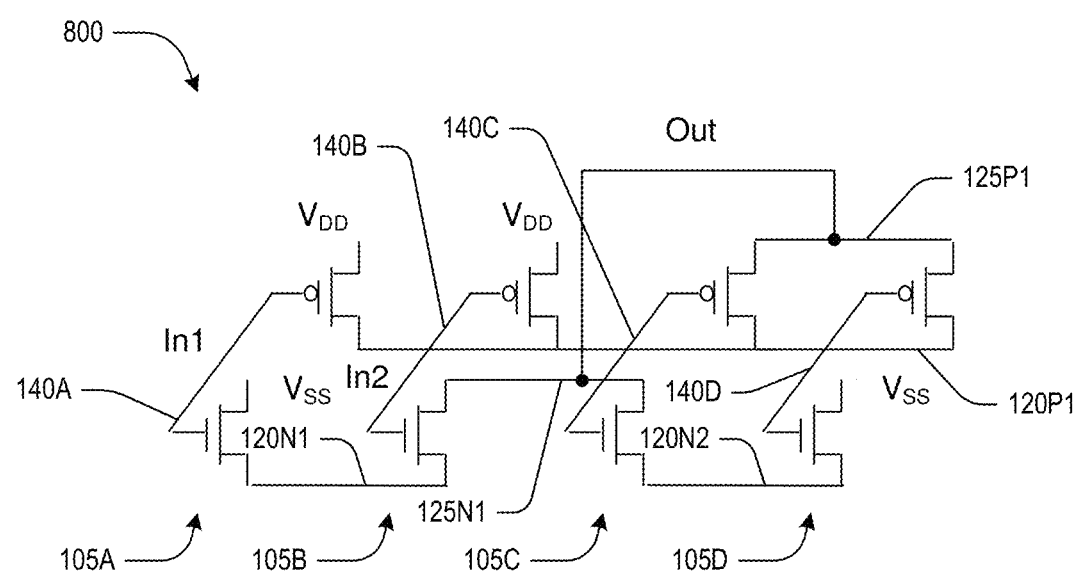
Figure 8B:
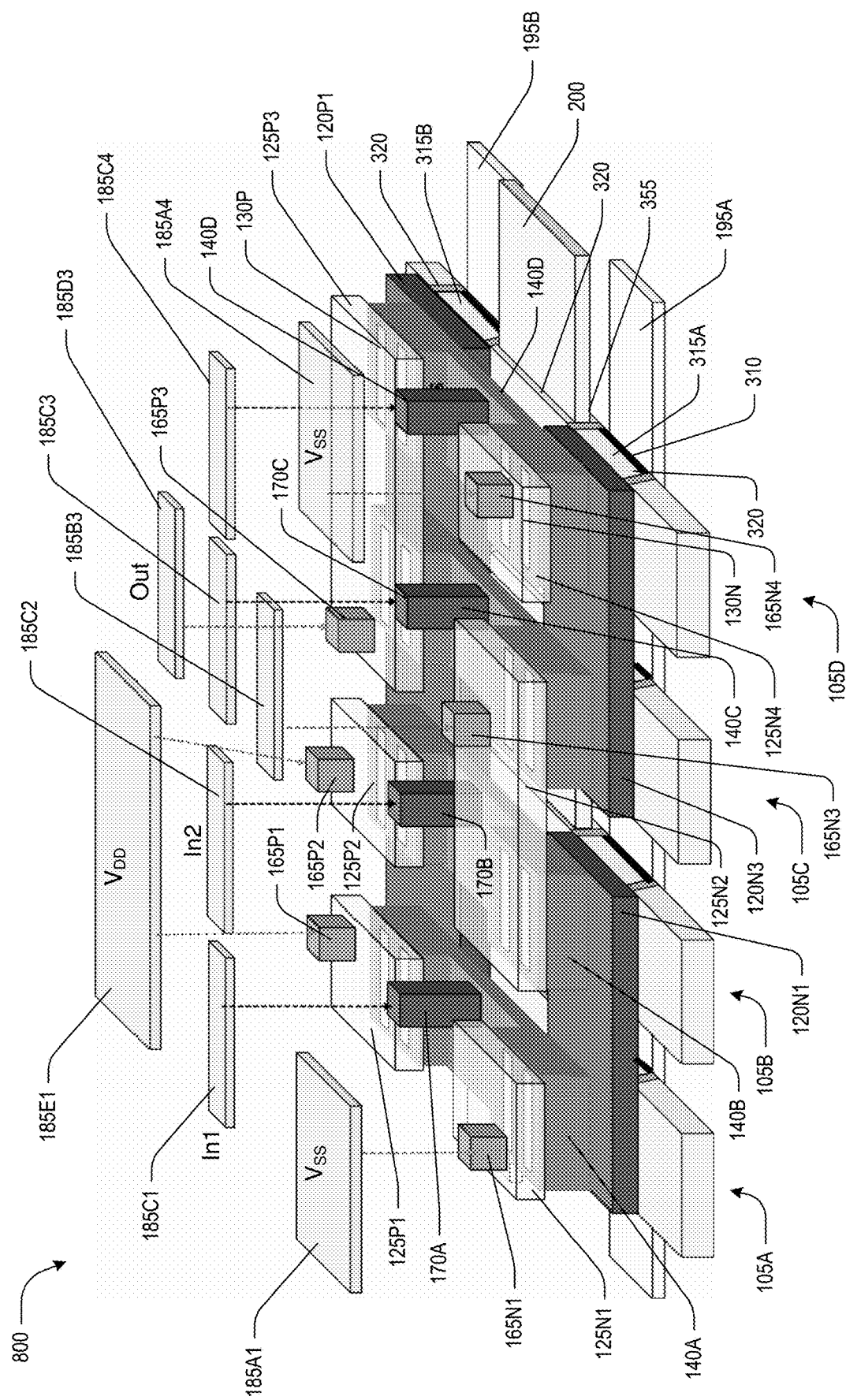

Referring to FIGS. 8A and 8B, a circuit diagram and a simplified isometric view of a two-input AND-OR Inverter 800 is provided, according to some embodiments. In some embodiments, the AND-OR Inverter 800 is implemented using four unit cells 105A, 105B, 105C, 105D. The unit cells 105A, 105B, 105C, 105D illustrated in FIG. 8B are simplified for ease of illustration. The unit cells 105A, 105B have a shared source pad 120N1, and the unit cells 105B, 105C have a shared source pad 120N3. The unit cells 105A, 105B, 105C, 105D have a shared source pad 120P1. The unit cells 105B, 105C have a shared drain pad 125N2. The unit cells 105C, 105D have a shared drain pad 125P3. Conductive line 185A1 provides $V_{SS}$ to the drain pad 125N1 of the unit cell 105A via the drain contact 165N1. Conductive line 185E1 provides $V_{DD}$ to the drain pads 125P1, 125P2 of the unit cells 105A, 105B via the drain contacts 165P1, 165P2. Conductive line 185A4 provides $V_{SS}$ to the drain pad 125N4 of the unit cell 105D via the drain contact 165N4. Conductive line 185B3 is connected to the drain pad 125N2 via the drain contact 165N3. Conductive line 185D3 is connected to the drain pad 125P3 via the drain contact 165P. The conductive lines 185B3, 185D3 are interconnected in an overlying metallization layer. Conductive line 185C1 is connected to the gate pad 140A of the unit cell 105A via the gate contact 170A. Conductive line 185C2 is connected to the gate pad 140B of the unit cell 105B via the gate contact 170B. Conductive line 185C3 is connected to the gate pad 140C of the unit cell 105C via the gate contact 170C. Conductive line 185C4 is connected to the gate pad 140D of the unit cell 105D via the gate contact 170D. Inputs, In1, In2 of the AND-OR Inverter 800 are received via conductive lines 185C1, 185C2, and an output of the AND-OR Inverter 800 is present on the interconnected conductive lines 185B3, 185D3.

Figure 9A:
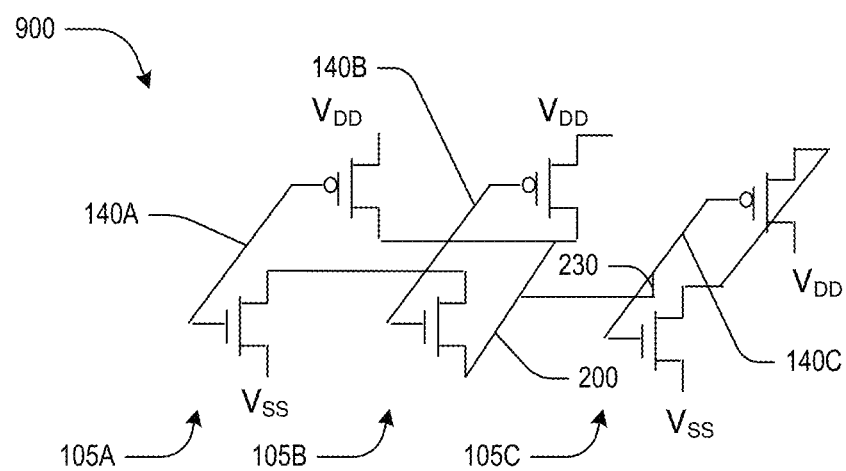
Figure 9B:
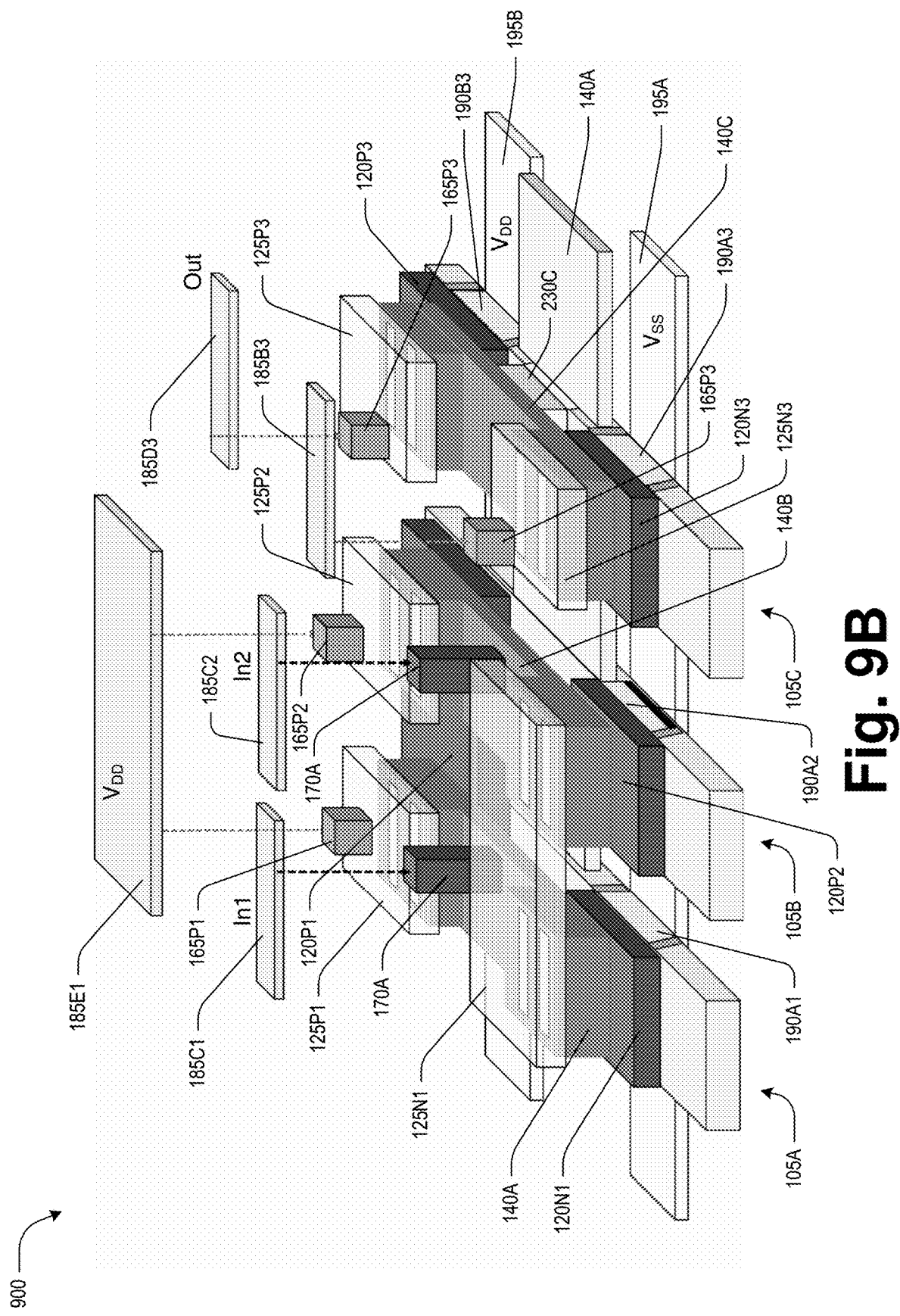

Referring to FIGS. 9A and 9B, a circuit diagram and a simplified isometric view of a two-input AND gate 900 is provided, according to some embodiments. In some embodiments, the AND gate 900 is implemented using three unit cells 105A, 105B, 105C. The unit cells 105A, 105B, 105C illustrated in FIG. 8B are simplified for ease of illustration. The unit cells 105A, 105B have a shared source pad 120P1. The unit cells 105A, 105B have a shared drain pad 125N1. In accordance with the processing illustrated in FIGS. 4A-4E, the backside contacts 190A1, 190A3 of the unit cells 105A, 105C are connected to the backside conductive line 195A and $V_{SS}$ is provided to the source pads 120N1, 120N3 of the unit cells 105A, 105C via the backside conductive line 195A. In accordance with the processing illustrated in FIGS. 4A-4E, the backside contact 190B3 of the unit cell 105C is connected to the backside conductive line 195B and $V_{DD}$ is provided to source pad 120P3 of the unit cell 105C via the backside conductive line 195B. Conductive line 185E1 provides $V_{DD}$ to the drain pads 125P1, 125P2 of the unit cells 105A, 105B via drain contacts 165P1, 165P2. In accordance with the processing of FIGS. 3A-3I, the backside contact 190A2 and the backside contact 190B (not visible) of the unit cell 105B are connected to the backside interconnect line 200. In accordance with the processing of FIGS. 5A-5D, the gate pad 140C of the unit cell 105C is connected to the backside interconnect line 200 via backside gate contact 230C. Conductive lines 185B3, 185D3 are connected to the drain pads 125N3, 125P3 via drain contacts 165N3, 165P3, respectively. Conductive lines 185B3, 185D3 are connected to one another in an overlying metallization layer. Conductive line 185C1 is connected to the gate pad 140A of the unit cell 105A via gate contact 170A. Conductive line 185C2 is connected to the gate pad 140B of the unit cell 105B via gate contact 170B. Inputs, In1, In2 of the AND gate 900 are received via conductive lines 185C1, 185C2, and an output of the AND gate 900 is provided on the interconnected conductive lines 185B3, 185D3.

Figure 10:
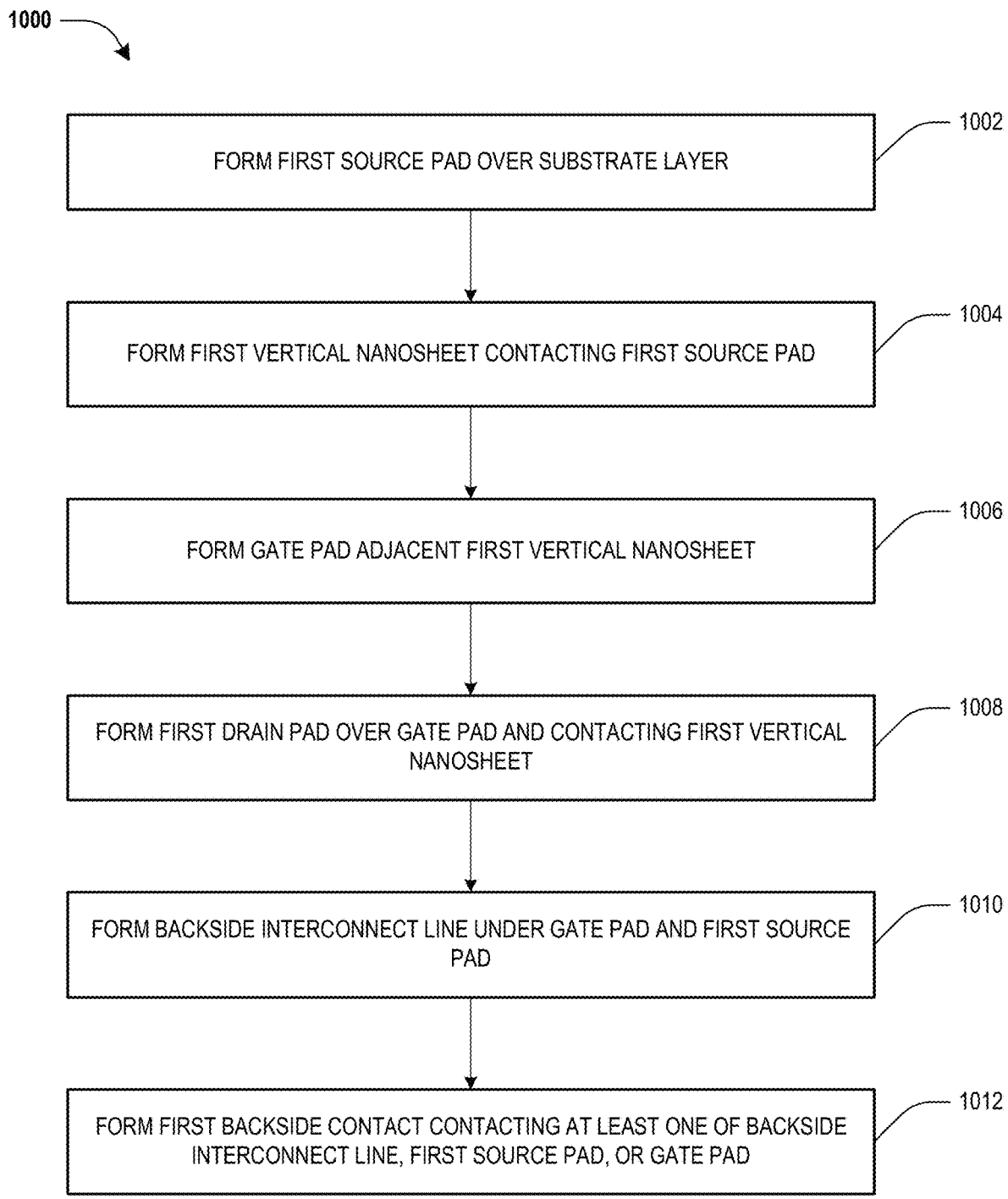
FIG. 10 is a flow chart illustrating a method of handling a semiconductor substrate, in accordance with some embodiments.

FIG. 10 is a flow diagram illustrating a method 1000 for forming a semiconductor arrangement 100, in accordance with some embodiments. At 1002, a first source pad 120N, 120P is formed over a semiconductor layer 115. At 1004, a first nanosheet 130N, 130P is formed contacting the first source pad 120N, 120P. At 1006, a gate pad 140 is formed adjacent the first nanosheet 130N, 130P. At 1008, a first drain pad 125N, 125P is formed over the gate pad 140 and contacting the first nanosheet 130N, 130P. At 1010, a backside interconnect line 200 is formed under the gate pad 140 and the first source pad 120N, 120P. At 1012, a first backside contact 190A, 190B is formed contacting at least one of the backside interconnect line 200, the first source pad 120N, 120P, or the gate pad 140.

Figure 11:
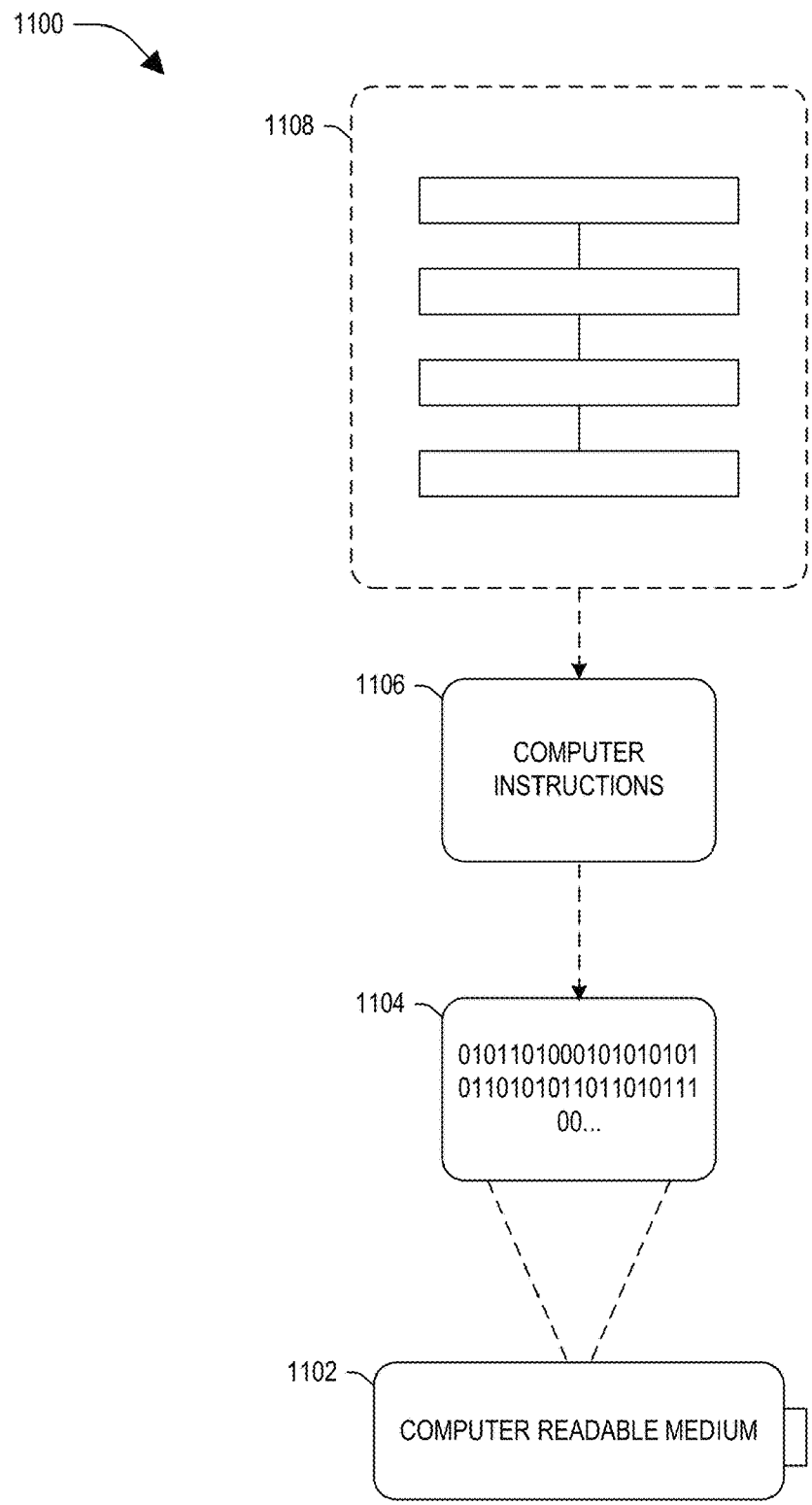
FIG. 11 illustrates an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium is illustrated in FIG. 11, wherein the embodiment 1100 comprises a computer-readable medium 1102 (e.g., a CD-R, DVD-R, flash drive, a platter of a hard disk drive, etc.), on which is encoded computer-readable data 1104. This computer-readable data 1104 in turn comprises a set of processor-executable computer instructions 1106 configured to operate according to one or more of the principles set forth herein. In some embodiments 1100, the processor-executable computer instructions 1106 are configured to perform a method 1108, such as at least some of the aforementioned described methods. In some embodiments, the processor-executable computer instructions 1106 are configured to implement a system, such as at least some of the aforementioned systems. Many such computer-readable media may be devised by those of ordinary skill in the art that are configured to operate in accordance with the techniques presented herein.

Figure 12:
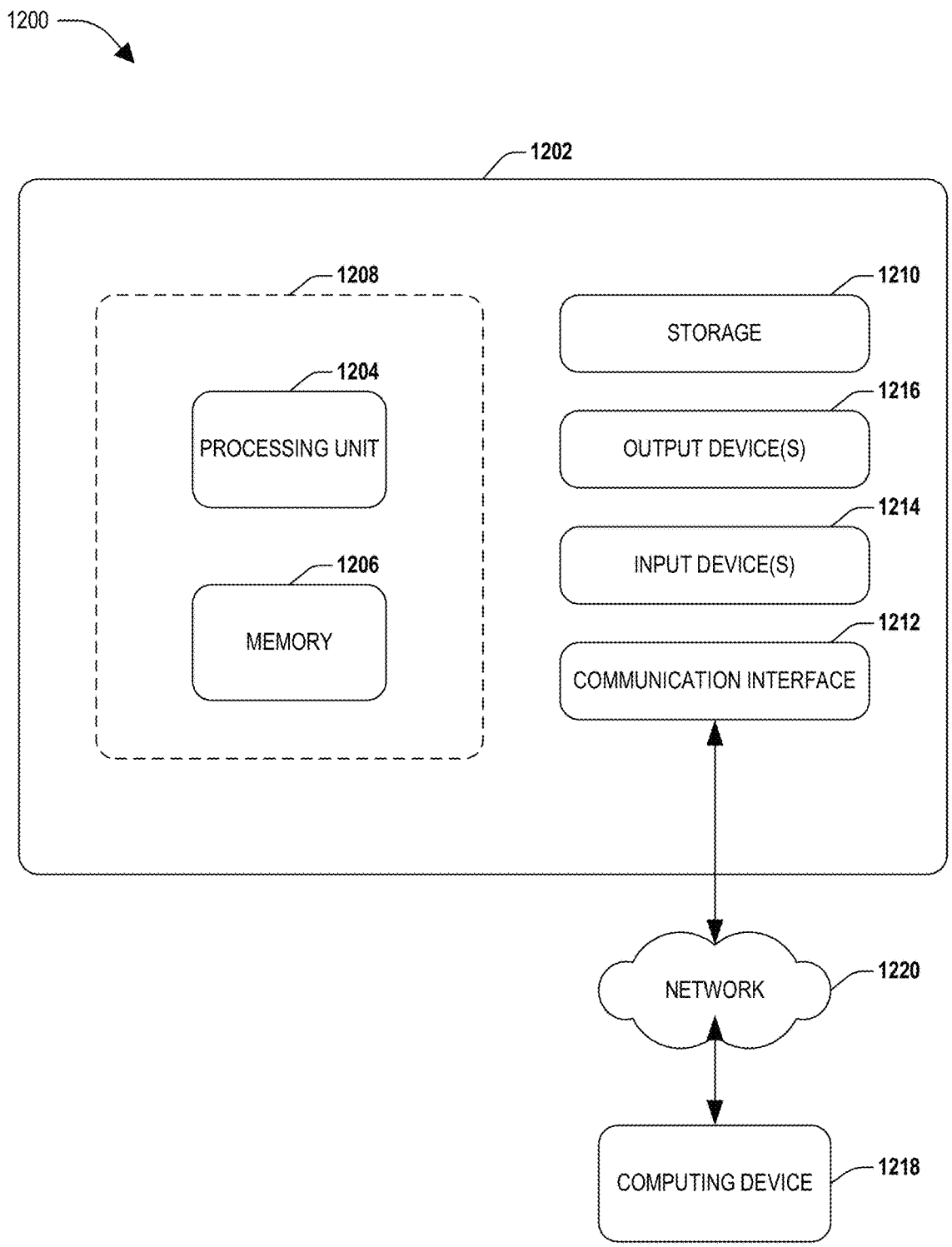
FIG. 12 illustrates an example computing environment wherein one or more of the provisions set forth herein may be implemented, in accordance with some embodiments.

FIG. 12 and the following discussion provide a brief, general description of a suitable computing environment to implement embodiments of one or more of the provisions set forth herein. The operating environment of FIG. 12 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 12 depicts an example of a system 1200 comprising a computing device 1202 to implement some embodiments provided herein. In some configurations, computing device 1202 includes at least one processing unit 1204 and memory 1206. Depending on the exact configuration and type of computing device, the memory 1206 may be volatile (such as random-access memory (RAM), for example), non-volatile (such as read-only memory (ROM), flash memory, etc., for example) or some combination of the two. This configuration is illustrated in FIG. 12 by dashed line 1208.

In some embodiments, the computing device 1202 may include additional features and/or functionality. For the example, the computing device 1202 may also include additional storage (e.g., removable and/or non-removable) including, but not limited to, magnetic storage, optical storage, and the like. Such additional storage is illustrated in FIG. 12 by storage 1210. In some embodiments, computer readable instructions to implement one or more embodiments provided herein may be in the storage 1210. The storage 1210 may also store other computer readable instructions to implement an operating system, an application program, and the like. Computer readable instructions may be loaded in the memory 1206 for execution by the processing unit 1204, for example.

The term "computer readable media" as used herein includes computer storage media. Computer storage media includes volatile and nonvolatile, removable and non-removable media implemented in any method or technology for storage of information such as computer readable instructions or other data. The memory 1206 and storage 1210 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by the computing device 1202. Any such computer storage media may be part of the computing device 1202.

In some embodiments, the computing device 1202 comprises a communication interface 1212, or a multiple communication interfaces, that allow the computing device 1202 to communicate with other devices. The communication interface 1212 may include, but is not limited to, a modem, a Network Interface Card (NIC), an integrated network interface, a radio frequency transmitter/receiver, an infrared port, a Universal Serial Bus (USB) connection, or other interface for connecting the computing device 1202 to other computing devices. The communication interface 1212 may implement a wired connection or a wireless connection. The communication interface 1212 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

The computing device 1202 may include input device(s) 1214 such as keyboard, mouse, pen, voice input device, touch input device, infrared cameras, video input devices, and/or any other suitable input device. An output device(s) 1216 such as one or more displays, speakers, printers, and/or any other suitable output device may also be included in the computing device 1202. The input device 1214 and the output device 1216 may be connected to the computing device 1202 via a wired connection, wireless connection, or any combination thereof. In some embodiments, an input device or an output device from another computing device may be used as the input device(s) 1214 or the output device(s) 1216 for the computing device 1202.

Components of the computing device 1222 may be connected by various interconnects, such as a bus. Such interconnects may include a Peripheral Component Interconnect (PCI), such as PCI Express, a USB, firewire (IEEE 1394), an optical bus structure, and the like. In some embodiments, components of the computing device 1202 may be interconnected by a network. For example, the memory 1206 may be comprised of multiple physical memory units located in different physical locations interconnected by a network.

Those skilled in the art will realize that storage devices utilized to store computer readable instructions may be distributed across a network. For example, a computing device 1218 accessible via a network 1220 may store computer readable instructions to implement one or more embodiments provided herein. The computing device 1202 may access the computing device 1218 and download a part or all of the computer readable instructions for execution. Alternatively, the computing device 1202 may download pieces of the computer readable instructions, as needed, or some instructions may be executed at the computing device 1202 and some instructions may be executed at the computing device 1218.

In some embodiments, a vertical architecture for unit cells 105 employing nanosheets 130N, 130P and backside interconnections allows top side or backside contacts to be provided to apply power supply voltages or gate voltages to the unit cell 105. A backside interconnect line 200 under the unit cell 105 allows flexibility in interconnecting the unit cells 105. The backside interconnect line 200 may be connected to source pads 120N or gate pads 140 of transistors 110N, 110P in the unit cell 105. Vertical nanowire devices in unit cell provide decreased capacitance compared to a finFET device. Using different backside connection schemes, different devices, such as inverters, NAND devices, AND-OR inverters, AND devices, or other suitable devices may be implemented using the same basic vertical device arrangement.

According to some embodiments, a semiconductor arrangement includes a first source pad formed over a semiconductor layer. A first nanosheet contacts the first source pad. A gate pad is adjacent the first nanosheet. A first drain pad is over the gate pad and contacts the first nanosheet. A backside interconnect line is under the gate pad and the first source pad.

According to some embodiments, a method of forming a semiconductor arrangement includes forming a first source pad over a semiconductor layer. A first nanosheet is formed contacting the first source pad. A gate pad is formed adjacent the first nanosheet. A first drain pad is formed over the gate pad and contacting the first nanosheet. A backside interconnect line is formed under the gate pad and the first source pad. A first backside contact is formed contacting at least one of the backside interconnect line, the first source pad, or the gate pad.

According to some embodiments, a semiconductor arrangement includes a first unit cell and a second unit cell. The first unit cell includes a first vertical n-type transistor having a first n-type source pad, a first vertical p-type transistor having a first p-type source pad, and a first backside contact contacting the first p-type source pad. The second unit cell includes a second vertical n-type transistor having a second n-type source pad and a second vertical p-type transistor having a second p-type source pad. A first backside conductive line contacts the first backside contact. A backside interconnect line is under the first unit cell and the second unit cell.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc., depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc.

For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a first source pad over a semiconductor layer;
   a first nanosheet contacting the first source pad;
   a gate pad adjacent the first nanosheet;
   a first drain pad over the gate pad and contacting the first nanosheet;
   a backside interconnect line under the gate pad and the first source pad;
   a first backside contact contacting the first source pad;
   a first backside conductive line contacting the first backside contact; and
   a dielectric material between the first backside contact and the backside interconnect line.

2. The semiconductor arrangement of claim 1, comprising:
   a cap layer between the first backside contact and the first backside conductive line.

3. The semiconductor arrangement of claim 1, wherein the dielectric material is between the first backside contact and the semiconductor layer.

4. The semiconductor arrangement of claim 1, wherein the first backside contact is between the semiconductor layer and the backside interconnect line.

5. The semiconductor arrangement of claim 1, comprising:
   a shallow trench isolation (STI) structure underlying the gate pad.

6. The semiconductor arrangement of claim 1, comprising:
   a cap layer underlying the backside interconnect line.

7. The semiconductor arrangement of claim 1, comprising:
   a first cap layer underlying the first backside contact; and
   a second cap layer underlying the backside interconnect line, wherein the dielectric material is between the first cap layer and the second cap layer.

8. The semiconductor arrangement of claim 1, comprising:
   a second source pad formed over the semiconductor layer;
   a second nanosheet contacting the second source pad; and
   a second drain pad over the gate pad and contacting the second nanosheet.

9. The semiconductor arrangement of claim 8, comprising:
   a second backside contact contacting the second source pad.

10. The semiconductor arrangement of claim 1, comprising:
    a backside gate contact contacting the backside interconnect line and the gate pad.

11. A method of forming a semiconductor arrangement, comprising:
    forming a first source pad over a semiconductor layer;
    forming a first nanosheet contacting the first source pad;
    forming a gate pad adjacent the first nanosheet;
    forming a first drain pad over the gate pad and contacting the first nanosheet;
    forming a backside interconnect line under the gate pad and the first source pad; and
    forming a first backside contact to connect the backside interconnect line to the gate pad.

12. The method of claim 11, comprising:
    forming a second backside contact underlying the first source pad; and
    forming a backside conductive line under the second backside contact.

13. The method of claim 12, comprising:
    forming a cap layer between the backside conductive line and the second backside contact.

14. The method of claim 12, comprising:
    forming a spacer layer between the second backside contact and the backside interconnect line.

15. The method of claim 11, wherein forming the first backside contact comprises forming the first backside contact through the semiconductor layer.

16. A semiconductor arrangement, comprising:
    a first source pad and a second source pad over a semiconductor layer;
    a first nanosheet contacting the first source pad;
    a second nanosheet contacting the second source pad;
    a gate pad adjacent the first nanosheet;
    a first drain pad over the gate pad and contacting the first nanosheet;
    a second drain pad over the gate pad and contacting the second nanosheet;
    a backside interconnect line under the gate pad and the first source pad;
    a first backside contact contacting the first source pad; and
    a second backside contact contacting the second source pad.

17. The semiconductor arrangement of claim 16, wherein the gate pad is between the first nanosheet and the second nanosheet.

18. The semiconductor arrangement of claim 16, wherein the backside interconnect line underlies the gate pad, the first source pad, and the second source pad.

19. The semiconductor arrangement of claim 16, comprising:
    a cap layer between the first backside contact and a backside conductive line under the first backside contact.

20. The semiconductor arrangement of claim 16, comprising:
    a shallow trench isolation (STI) structure under the gate pad.

* * * * *